United States Patent [19]
Lancaster et al.

[11] Patent Number: 5,789,776
[45] Date of Patent: Aug. 4, 1998

[54] SINGLE POLY MEMORY CELL AND ARRAY

[75] Inventors: Loren T. Lancaster; Ryan T. Hirose, both of Colorado Springs, Colo.

[73] Assignee: NVX Corporation, Colorado Springs, Colo.

[21] Appl. No.: 715,569

[22] Filed: Sep. 18, 1996

Related U.S. Application Data

[60] Provisional application No. 60/004,173 Sep. 22, 1995.

[51] Int. Cl.$^6$ .................. H01L 27/108; H01L 29/76; H01L 29/94; H01L 31/119
[52] U.S. Cl. ............................. 257/296; 257/324
[58] Field of Search ........................ 257/324, 408, 257/399, 296

[56] References Cited

U.S. PATENT DOCUMENTS

| | | | |
|---|---|---|---|
| 3,846,768 | 11/1974 | Krick | 340/173 R |
| 4,103,344 | 7/1978 | Fagan et al. | 365/184 |
| 4,112,507 | 9/1978 | White et al. | 356/184 |
| 4,138,737 | 2/1979 | McCann | 365/78 |
| 4,769,787 | 9/1988 | Furusawa et al. | 365/184 |
| 5,387,534 | 2/1995 | Prall | 437/52 |
| 5,424,569 | 6/1995 | Prall | 257/324 |
| 5,467,300 | 11/1995 | Komarek et al. | 257/296 |
| 5,510,638 | 4/1996 | Lancaster et al. | 257/314 |
| 5,656,837 | 8/1997 | Lancaster et al. | 257/399 |

*Primary Examiner*—Stephen Meier
*Attorney, Agent, or Firm*—Richard A. Bachand; Holland & Hart LLP

[57] ABSTRACT

A non-volatile memory cell array using only a single level of polysilicon and a single level of metal has programmable single transistor memory cells on a semiconductor substrate of a first conductivity type, a well of a second conductivity type in the substrate, parallel bitlines oriented in a first direction, and reference line segments oriented in the first direction. Each reference line is paired with one of each bitline. The array also has parallel word lines oriented in a second direction to form an array of intersections with the pairs of bitline/reference line pairs, and a rewriteable single transistor memory cell at each intersection point.

33 Claims, 9 Drawing Sheets

5,789,776

SINGLE POLY MEMORY CELL AND ARRAY

CROSS REFERENCES TO RELATED APPLICATIONS

This application is related to provisional patent application Ser. No. 60/004,173, filed Sep. 22, 1995, by the applicants hereof, to which priority is claimed, and which is incorporated herein by reference.

BACKGROUND OF THE INVENTION

1. Field of the Invention

The present invention relates to improvements in semiconductor memories and, more particularly, to improvements in electrically erasable, electrically programmable read-only non-volatile memories used for large capacity data storage.

2. Description of the Related Art

The cost of manufacturing solid state non-volatile memory products continues to be high compared to the cost of building DRAM memory products. This manufacturing cost difference prohibits systems from using solid state nonvolatile memory in cost sensitive markets where remote power backed DRAM solutions are possible. As in almost all memory technologies and applications, the costs of manufacturing the basic memory non-volatile memory cell element has a large and direct impact on the overall memory product cost. Therefore, specific manufacturing techniques need to be developed for building non-volatile memory cells which lower costs.

Memory cell cost can be simply thought of as the product of number of photolithography mask steps required to build the cell times the area of the memory cell. However, most applications allow a memory cell designer to seek cost reduction through reductions in one of these two parameters, and rarely both simultaneously. For example, memory which is embedded in an integrated circuit that primarily performs a logic function, such as a microcontroller, may have far fewer cells than a product that primarily acts as a memory storage device. Further, the logic based product can usually be constructed with far fewer masking steps than a memory product. Therefore, memory embedded in logic integrated circuits achieve low cell cost primarily through low mask count, rather than small cell size. Conversely, in products which function primarily as memory and therefore include large numbers of memory cells, small cell size is the primary cost reduction means, typically resulting in a higher number of masking steps. In all cases, it is difficult to achieve high performance while also achieving low cost. The combination of both is especially important for embedded non-volatile memories.

In the past "AND architecture" non-volatile memory array architectures have been proposed and manufactured which use memory cells that reside between vertical pairs of bits and source lines and use field oxide isolation between adjacent columns. The memory cells in the array share common bit and source lines within a column and share wordlines in common along horizontal rows. The memory cell often has two transistors, but can also include a single transistor. However, existing AND architecture embedded memory does not achieve both low cost and high performance. Further, costs of ultra small AND architecture memory cells are higher than could theoretically exist due to extraneous level-to-level alignment tolerances required within the cell.

One solution to these problems have been proposed in U.S. Pat. No. 5,510,638 where Poly Field Shield isolation is used to build a memory cell with no alignment tolerances. Although this architecture produces the smallest possible AND memory cell, it is desirable in some situations to achieve low cost without an additional layer of polysilicon by using conventional field oxide isolation. For example, many manufacturing facilities prefer not to deal with the complexity of processing two layers of polysilicon, especially those operated by logic manufacturers. Also, high density manufacturers may also choose to avoid a second level of polysilicon if a small memory cell can be achieved through the use of other process means. Therefore, further innovation is required to lower costs reduce process complexity for AND architecture memory cells for embedded applications and high density memory products that can use only a single layer of polysilicon and a single level of metal within the memory cell array.

SUMMARY OF THE INVENTION

In light of the above, it is an object of the invention to provide an improved non-volatile semiconductor memory device that provides the lowest possible cost compared to prior art devices.

It is another object of the invention to provide an improved non-volatile semiconductor memory device using a single level of polysilicon and a single level of metal within the memory cell array which achieves high read speed by minimizing the row propagation delay time.

Another object of the invention is to provide an improved non-volatile semiconductor memory device using a single level of polysilicon and a single level of metal within the memory cell array which achieves high read speed by minimizing the bitline signal development time.

It is further an object of the invention to provide an improved non-volatile semiconductor memory device using a single level of polysilicon and a single level of metal within the memory cell array which achieves the smallest planar cell size by eliminating alignment tolerances.

The above and further objects, details and advantages of the invention will become apparent from the detailed description of the preferred embodiments presented hereinafter, when read in conjunction with the accompanying drawings.

According to the present invention, there is provided a non-volatile memory cell array using only a single level of polysilicon and a single level of metal that includes programmable single transistor memory cells on a semiconductor substrate of a first conductivity type, a well of a second conductivity type in the substrate, parallel bitlines oriented in a first direction, reference line segments oriented in the first direction, each paired with one of each bitline, parallel word lines oriented in a second direction over the semiconductor region to form an array of intersections with the pairs of bitline/reference line pairs, a rewriteable single transistor memory cell residing at each intersection point, forming a non-volatile memory cell array, with the drain connected to the bit line and the source connected to the reference line segments. The memory cell array is placed within the well and includes memory transistors that include a pair of source and drain regions of a first conductivity type formed in the surface of the semiconductor regions within the well, a control gate, and a charge accumulation layer that has programmable memory states the produce a depletion threshold voltage in one state and an enhancement threshold voltage in an other state, such as a layer of silicon nitride, formed to cover the semiconductor area between the source and drain regions. The well area provides junction isolation between the bias applied to the bulk of the memory transistors and the bias applied to other circuitry within the non-volatile memory in regions peripheral to the memory cell array. Peripheral circuits include a driving circuit for biasing the reference line segments during a read mode to a potential, say Vread, of opposite polarity of the depletion state threshold voltage and with a magnitude within the range of the largest magnitude of the depletion threshold voltage and the supply voltage.

BRIEF DESCRIPTION OF THE DRAWINGS

In the detailed description of preferred embodiments of the invention presented below, reference is made to the accompanying drawing of which.

DETAILED DESCRIPTION OF THE PREFERRED EMBODIMENTS

Figure 1:
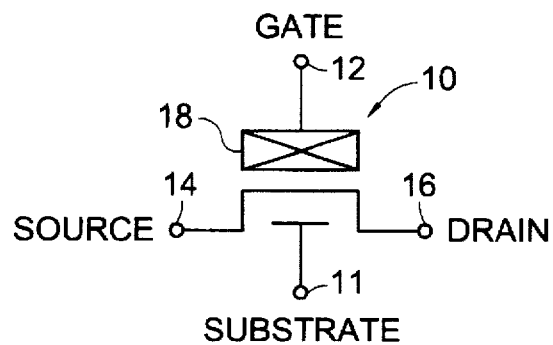
FIG. 1 shows a schematic representation of a single transistor non-volatile memory cell utilizing a silicon nitride dielectric charge accumulation layer according to a preferred embodiment of the invention.

As seen in FIG. 1, a schematic of a memory cell 10 that can be used in practicing the invention is illustrated. The memory cell 10 is formed with a single transistor that has a storage layer of non-conducting, non-volatile material between its gate electrode 12 and the transistor channel.

Additional non-conducting layers may also be provided between the gate 12 and the channel to form a multi-layer gate dielectric.

The material of the non-volatile gate dielectric is preferably of a type capable of having its properties altered by the application of an electric field or by the conduction of current with its accompanying electric field between the gate and the channel of the transistor, and imparts to the transistor negative thresholds of magnitudes less than $V_{cc}$ by at least $V_{ds,sat}$ in a freshly erased cell. This value is typically at least 1 volt, but is greater than an amount necessary to allow a current flow in the device in a read operation. The properties that may be altered in the material are typically either a stored charge, a molecular structure change, or an atomic structure change. Such non-conducting layers may comprise insulating materials of thicknesses less than 500 angstroms.

Examples of suitable materials of which the nonvolatile gate dielectric may be constructed include, but are not limited to, oxides, oxynitrides, silicon rich oxide, silicon nitride, silicon oxynitride, silicon rich silicon dioxide, tantalum pentoxide, carbides, ceramics, aluminum oxide, silicon carbide or ferroelectric materials, or other suitable dielectrics or multilayered dielectrics, such as SNOS, and SONOS. These materials have such advantages over other materials that they are generally non-conductive compared to heavily doped silicon; they are capable of being semi-permanently altered on a molecular or atomic level by an electric field or current with its accompanying electric field; their retention properties affect the surface potential of the memory cell transistor; they have properties that are stable over a wide range of temperature consistent with commercial semiconductor products; and their alteration property is to the first order reversible.

The change in properties in the above-mentioned materials affects the surface potential of the channel of the transistor to significantly alter the channel conductance under bias. Thus, different levels of conductivity correspond to different logic states. For example, an "on" or conducting state may indicate a logic '0' and an "off" or non-conducting state may indicate a logic '1'. Therefore, by sensing the drain-to-source current under bias, the state of the stored information can be determined. Since the information is stored in a non-volatile form, the information remains stored for a period of time, typically ten years or longer, regardless of whether power is applied to the memory cell 10 or any product containing the memory cell 10.

The memory cell 10 is a single transistor having a diffused source node 14, a diffused drain node 16, a gate node 12, and a substrate node 11. The non-volatile layer 18 is schematically represented as a box with a cross between the gate and the channel to denote the presence of a nonvolatile film.

A preferred operation of an N-channel embodiment of a cell in accordance with the invention is summarized in Table 1 below.

TABLE 1

| Node | Read | Read Inhibit | Erase | Program | Program Inhibit |
|---|---|---|---|---|---|
| Substrate (P-well) | $V_{ss}$ | $V_{ss}$ | $V_{cc}$ | $V_{pp}$ | $V_{pp}$ |
| Source | $V_r$ | $V_r$ | $V_{cc}$ | $V_{pp}$ | $V_{cc}$ |
| Drain | $V_{cc}$ | $V_{cc}$ | $V_{cc}$ | $V_{pp}$ | $V_{cc}$ |
| Gate | $V_r$ | $V_{ss}$ | $V_{pp}$ | $V_{cc}$ | $V_{cc}$ |

In Table 1, $V_{ss}$ is a reference potential, such as ground or a negative potential with respect to ground, for example $V_r$ less than ground, $V_{cc}$ is a supply voltage, $V_{pp}$ is a programming voltage, and $V_r$ is a read voltage, below described in detail. It should also be noted that the conditions shown in Table 1 are for a N-channel device within a P-well. The device could be adapted to a P-channel device by appropriately changing the bias polarities and interchanging the Erase and Program state condition. For an N-channel device, $V_{ss}$ is a reference potential, such as ground or zero potential, $V_{cc}$ is a positive potential with respect to $V_{ss}$, typically between 3.0 and 6.0 volts, $V_{pp}$ is a negative potential with respect to $V_{cc}$, typically within a range of $V_{ss}$ to $-10$ volts, and $V_r$ is a positive potential with respect to $V_{ss}$, typically within a range of 1.0 and 3.0 volts.

The cell 10 is read by the application of a voltage difference between the drain 16 and source 14, while the gate 12 is based positive with respect to the substrate node 11 (or P-well) by an amount $V_r$, with the gate-to-source potential difference remaining zero. The logic state of the cell 10 may be determined by using known sensing circuitry to measure the channel current of cell 10 under the bias conditions described in the prior sentence.

One of the advantages provided by the circuit and method of the invention is that the value of $V_r$ is less than $V_{cc}$. It has been found that by using gate selection on a dielectric cell by bringing the source potential up from the potential of the substrate to a value $V_r$, the device can be deselected by bringing the gate potential from $V_r$ to $V_{ss}$, thereby turning off the source junction, and, consequently, creating no fields between the gate the substrate that may cause a disturb condition. The purpose of $V_r$ is to allow the method or system of reading individual cells in a cell array (best seen in FIG. 2 and Table 2 described hereinafter) without causing a disturb to the cells of the array, and particularly to the addressed cell(s). It should be noted that the read inhibit voltages are applied to the nonaddressed cells to actively deselect the nonaddressed cells, by applying $V_r$ to the sources and $V_{ss}$ to the gates of the transistors of the nonaddressed cells. Again, these voltages turn off the source junction, and, consequently, create no fields between the gate the substrate, reducing or eliminating any disturb conditions.

On the other hand, the upper limit of the magnitude of the value of $V_r$ should be selected to be less than $V_{cc}$, and preferably less than $V_{cc}-V_{ds,sat}$, where $V_{ds,sat}$ is the saturation voltage of the device. Since the voltage on the drain of a cell being read is $V_{cc}$, the value of $V_r$ on the source and gate should be selected to still enable sufficient current to flow to be detectable. Moreover, since the erase threshold decreases (becomes less negative) with age, a cell containing older data produces less current when addressed. Thus, the upper limit that can be selected for $V_r$ needs to take end of life conditions into consideration. Thus, preferably, $V_r$ should be selected to be as close to the threshold of a freshly erased cell as possible, which allows sufficient current to flow for reliable sensing at end of life.

In contrast to the cell read operation described above, the cell 10 may be "read inhibited" by setting the gate 12 equal to the potential of the substrate 11 at $V_{ss}$ while the drain 10 and the source 14 are set at the same potentials as used during a read operation, $V_{cc}$ and $V_r$ respectively. This operation is particularly useful when the cell 10 is connected in plurality with cells that share common bit and virtual source lines. In this configuration, one cell can be read while all other cells in parallel are "read inhibited" or deselected. This operation occurs without disturbing the data stored in either the addressed and selected cells or the unaddressed and deselected cells in a read operation.

The selection of an appropriate value of $V_r$ depends on a number of factors related to the threshold voltage of an erased device. More particularly, it is recognized that the threshold voltage of a freshly erased device is larger than that of a device at end of life. End of life is generally regarded to mean a time at which the thresholds of programmed and erased devices decay to predetermined acceptable levels, and is typically on the order of about 10 years. The range of suitable minimum values for $V_r$ is measured with regard to a freshly erased device, and can be selected to be a value that is of opposite polarity and larger in magnitude than the maximum erase threshold. The erase threshold is used to mean the threshold voltage for reading an erased cell. It will, of course be appreciated that an erase threshold can be established by design, taking into account the choice and thickness of the gate dielectric and nonvolatile materials, the size of the memory array, the number of cells that may be contributing to the output sense current, the voltage sensing capabilities of the sensing circuitry, and so forth. Thus, the erase threshold of a device should be such that the state of a single cell can unmistakably be sensed in the particular construction chosen, at any point during the lifetime of the stored data in that cell. So, $V_r$ may be selected to produce a maximum predetermined cell current in a deselected freshly erased cell, which, when summed over all the deselected cells on a common bit line, each being in a freshly erased state, will produce substantially less current than is required by sensing circuitry to correctly sense a program state in a single selected cell.

The cell 10 can be erased by setting the gate 12 potential to a negative value with respect to the channel or substrate. For example, the source 14, drain 16 and P-well 11 are biased at $V_{cc}$ while the gate is biased at $V_{pp}$. These conditions are held typically 10 milliseconds or less. The drain 16 or source 14, but not both simultaneously, could be allowed to "float" to the P-well potential.

In a similar manner, the cell 10 can be programmed by setting the substrate, source 14, and drain 16 to the same $V_{pp}$ potential, while setting the gate 12 potential to a positive value with respect to the channel or source 14. For example, the source 14, drain 16 and P-well 11 are biased at $V_{pp}$ while the gate is biased at $V_{cc}$. Again, the conditions are typically held for 10 milliseconds or less and the drain 16 or source 14, but not both simultaneously, could be allowed to float to the P-well potential.

Another feature of the single cell 10 device is its ability to "program inhibit" the cell 10 as shown in the Program Inhibit column of Table 1. This operation is used when a plurality of cells 10 share a common gate along a row. A single cell 10 along a row can be programmed while the other cells 10 on that row are program inhibited. If the erase state is to be preserved in the cell, then either or both or the source or drain nodes are biased at a voltage no greater than $V_{cc}$, but typically no less than $(V_{cc}+V_{pp})/b$ 2.

Thus, in operation, if a selected device is erased, $V_r$ is selected such that current flows in the device when the gate and source potentials are equal to $V_r$ and the drain potential is $V_{cc}$, which is larger than $V_r$. The potential in the erased device channel is between $V_{cc}$ and $V_r$, thus preventing a "disturb" condition by reinforcing the erase state of the dielectric. In a device which is not selected, $V_{ss}$ is applied to the gate; consequently, no or very little current flows while the source is at $V_r$. If an erased device has a negative threshold voltage less than $V_r$ in magnitude, a device with its gate at $V_{ss}$ will be off and there will be no gate to substrate (or channel) field to disturb the nonvolatile state.

On the other hand, if the device is programmed and has a positive threshold voltage, no current will flow under the read bias conditions of any of the cells. No channel will form in the programmed device and a voltage drop will occur that reinforces the programmed state, thus preventing a disturb condition. In a read inhibit condition with a programmed positive threshold voltage, a cell with its gate 12 at $V_{ss}$, will be off and the gate to substrate potential will be zero, which also is a non-disturb condition.

The drain 16 to source 14 current may be sensed or measured using any one of known techniques. If the cell 10 is erased, the channel is conductive and current flows from drain 16 to source 14. If cell 10 is programmed, the channel is non-conductive and none to a slight current is present.

Figure 2:
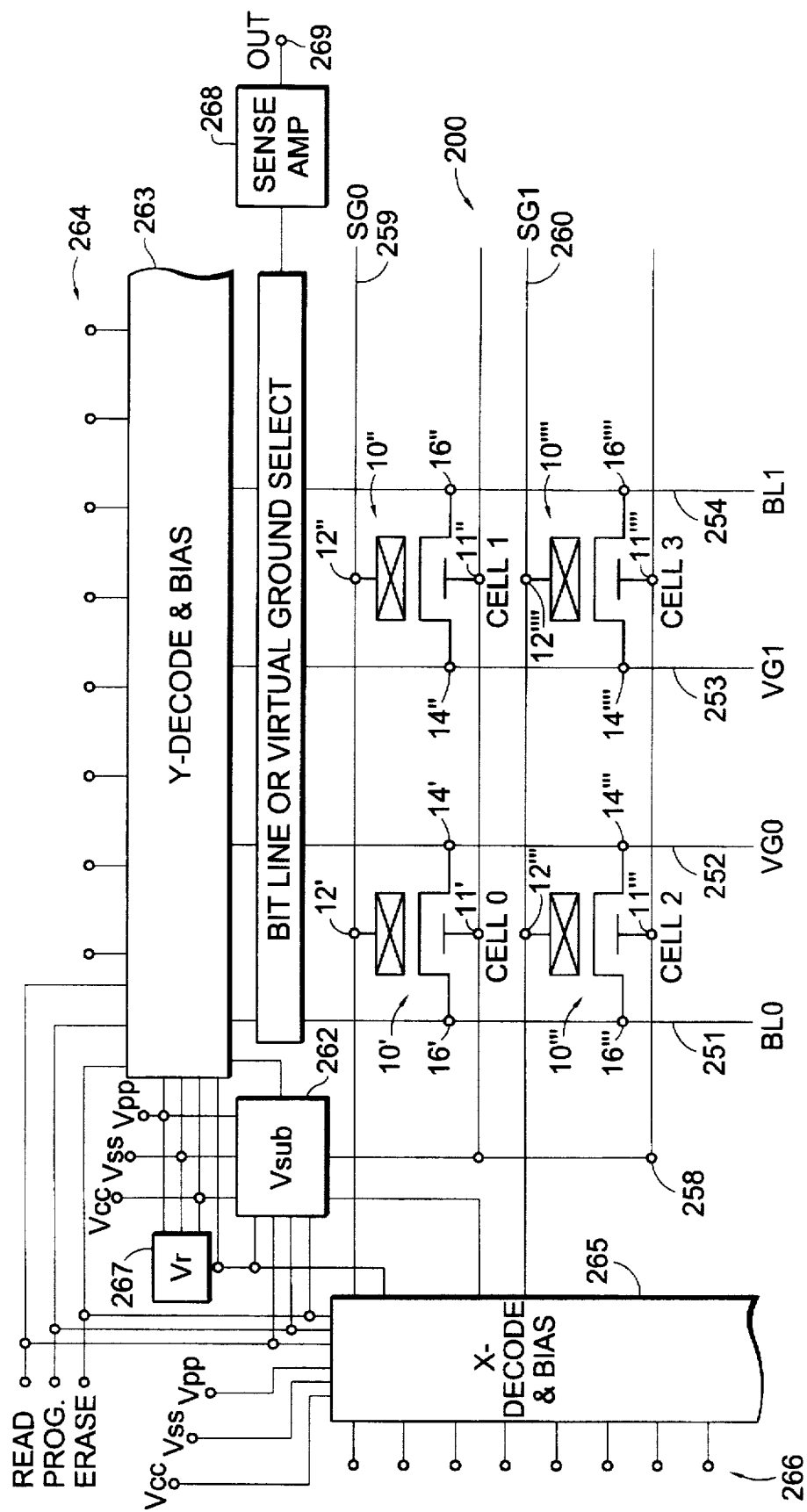
FIG. 2 schematically shows the overall circuit arrangement of the memory circuit according to a preferred embodiment of the invention.

As best seen in FIG. 2, the cell 10 may be arranged in a plurality of columns and rows of identical cells (10', 10", 10'", 10"") to form a cell array 200 to construct a high density memory product, such as a one or sixteen megabit flash memory device, or the like. The drawings illustrate a 2×2 array 200, but such figures are not intended to limit the number of cells 10 possible in an array 200.

As schematically shown in FIG. 2, the cells 10' and 10'" are connected at the source nodes 14' and 14'" to the virtual ground line 252, designated as VG0; and the source nodes 14" and 14"" of cells 10" and 10"" are connected to the virtual ground line 253, designated as VG1. Likewise, the drain nodes 16' and 16'" of the cells 10' and 10'" are connected the bit line 251, designated as BL0, and the drain nodes 16" and 16"" of the cells 10" and 10"" are connected to bit line 254, designated as BL1.

The cells 10' and 10" share a common gate line 259 (SG0), and cells 10'" and 10"" share a common gate line 260 (SG1). Simply stated, the drain nodes 16 and source nodes 14 are "shared" among the cells 10 in columns and the gate nodes 12 are "shared" among the cells 10 in rows. Since the source nodes 14 and drain nodes 16 are not "shared" among cells 10 in any row, independent control of source lines is possible, permitting unaddressed cells to be actively deselected for elimination of high currents and "disturbed" cells.

On the other hand, cells 10 with "shared" or common drain nodes 16 and source nodes 14 have separates gate nodes 12 permitting a single addressed cell 10 to be programmed or read. Of course, an entire row of cells 10 can be read, erased or programmed, if desired.

The bit lines BL0, BL1, . . . and virtual ground lines VG0, VG1, . . . of the individual cells 10'—10"" are addressed by signals from a Y-decoder 263, which decodes address signals applied to an input address bus 264. In like manner, the gate lines SG0, SG1, . . . are addressed by signals from an X-decoder 265, which decodes address signals applied to an input address bus 266. The X- and Y-decoders 265 and 263 each receive a read voltage $V_r$, from source 267, a supply voltage $V_{cc}$, a reference potential $V_{ss}$, and a programming voltage $V_{pp}$, for selective application to the respective bit, virtual ground, gate lines, and substrate of the array 200, as well as read, erase, and program control signals to specify the particular function to be performed and voltage levels to be selected and applied. The construction of the voltage source $V_r$ 267 can be a voltage divider, band gap, or other similar circuit. The control signals and addresses can be applied to the X- and Y-decoders internally or externally from the integrated circuit chip on which the array is constructed, in a manner known in the art. The current produced on either the bit lines BL0, BL1, . . . or the virtual ground lines VG0, VG1, . . . is sensed by a sense amplifier 268, for delivery to an output terminal 269. The sense amplifier 268 can be of any known suitable type.

Table 2 below describes a preferred operation of the cell array 200 shown in FIG. 2.

TABLE 2

| Node | Read Cells 0 & 1 Read Inhibit Cells 2 & 3 | Erase Cells 0 & 1 Deselect Cells 2&3 | Erase Inhibit Cells 2 & 3 Erase Deselect Cells 0 & 1 | Program Cell 0 Program Inhibit Cell 1 Deselect Cells 2&3 |
|---|---|---|---|---|
| Substrate (P-Well) | $V_{ss}$ | $V_{cc}$ | $V_{pp}$ | $V_{pp}$ |
| SG0 | $V_r$ | $V_{pp}$ | $V_{pp}$ | $V_{cc}$ |
| SG1 | $V_{ss}$ | $V_{cc}$ | $V_{cc}$ | $V_{pp}$ |
| BL0 | $V_{cc}$ | $V_{cc}$ | $V_{cc}$ | $V_{pp}$ |
| VG0 | $V_r$ | Float | Float | Float |
| BL1 | $V_{cc}$ | $V_{cc}$ | $V_{cc}$ | $V_{cc}$ |
| VG1 | $V_r$ | Float | Float | Float |

The cell array 200 can be read by sensing a current on the bit lines 251, 254 or the virtual ground lines 252, 253 by known sensing techniques, such as described later. If an erased device has a negative threshold voltage with its gate and source potential at $V_r$, established as described above, the erased device will be on and conducting current.

The cell array 200 enables a read system that allows a selection of individual cells 10 within a column of common cells 10 without causing a "disturb" condition. As described above, a "disturb" condition occurs when an electric field that is at a polarity that changes the state of the cell occurs between a gate and the substrate. A read inhibit bias system allows the active "deselection" of individual unaddressed cells within a column of common cells without causing a "disturb" condition. A program inhibit bias system allows the active "deselection" of individual cells within a row of common cells 10 without causing a "disturb" condition in a cell 10. Likewise, Erase Deselect and Program Deselect operations allow the active "deselection" of unaddressed rows during Erase and Program operation.

A group of cells in the array 200 can be Erased by biasing a gate, such as 12' to $V_{pp}$, while the array substrate bias is at $V_{cc}$, erasing all of the cells on gate line SG0 (259). Rows can be deselected during the Erase operation by biasing the common gates to $V_{cc}$, such as shown for rows SG1 (260) above in Table 2. Since the gate to substrate potential is zero on deselected gates during an Erase operation, no "disturb" condition results. The combination of bias condition within the array is called an Erase/Erase Deselect Operation. The erase bias conditions are typically established for 10 milliseconds or less.

A group of cells in the array 200, within one P-well or substrate, which share common row line gates with a second group of cells in array 200, within a separate P-well or substrate, can be Erase Inhibited and Erase Deselected while the second group is in an Erase/Erase Deselect Operation. The P-well or substrate of the first group is placed at $V_{pp}$ rather than $V_{cc}$ and all other biases remain the same as within the Erase/Erase Deleselect Operation group. The row which was under an Erase bias in the second group will be under an Erase Deselected bias in the first group without disturb, since the potential on the gate 12 is the same as that on the substrate 11, such as shown on SG0 (259) above in Table 2 and FIG. 2. The rows which are under Erase Deselect bias in the second group, such as SG1 (260), will be in an Erase Inhibit bias in the first group without disturb, since the drains 16 (and thus the transistor channels) are at Vcc. An inversion region channel will form in erased devices on Erase Inhibited rows. The inversion channel potential will be Vcc within these erased cells, preventing a disturb since the gates are also at Vcc. Programmed cells on the Erase Inhibited rows will not form an inversion channel, but will form a depletion layer beneath the gate. The voltage drop across the memory dielectric will be minimized, and will be of a polarity to reinforce the programmed state, rather than create a "disturb" condition.

Program conditions can be established on a common gate, and inhibited in all cells on that common gate except those for which a programmed state is desired. A program condition can be established by biasing the substrate or P-well at Vpp and placing a common gate at Vcc (such as SG0 on cells 0 and 1). If an erased state is to be preserved in any of the cells on the common gate, then either or both of the source or drain nodes of that cell are biased at an inhibit voltage no greater than Vcc, but no less than (Vcc+Vpp)/2 (such as in cell 1). With only one of the two at the inhibit voltage the other node must be allowed to float so that no current flows and the gate-to-channel voltage will be zero. During a program operation, isolation between adjacent cells can be improved with back bias by establishing a P-well 11 bias that is more negative than Vpp, typically by 0.5 to 2.0 volts. The program bias conditions are typically established for 10 milliseconds or less.

Since the program and program inhibit conditions are selected on a cell-by-cell basis, typical operation of a cell array will involve first erasing all the cells on a given common gate or common gate segment followed by a program or program inhibit operation of all of the same cells. By following this sequence, a byte, page or block of data can be stored by first erasing the data segment then programming the same segment, inhibiting where an erased state is desired. A byte is either eight or sixteen bits along a given row of cells 10, a page is a whole row of cells 10, and a block is a section of the memory array includes several rows and columns of cells 10. In a block operation, the entire block may be erased at once followed by a sequence of page or byte program operations on the cells within the block, such that each cell is either programmed or left erased by a program inhibit. Such a sequence of operations would be called a "write", a byte write, a page write, or a block write, depending on the data size. Another possibility is to erase an entire block, but program or inhibit within that block as data becomes available for storage at some later time, on a page or byte basis.

Figure 3:
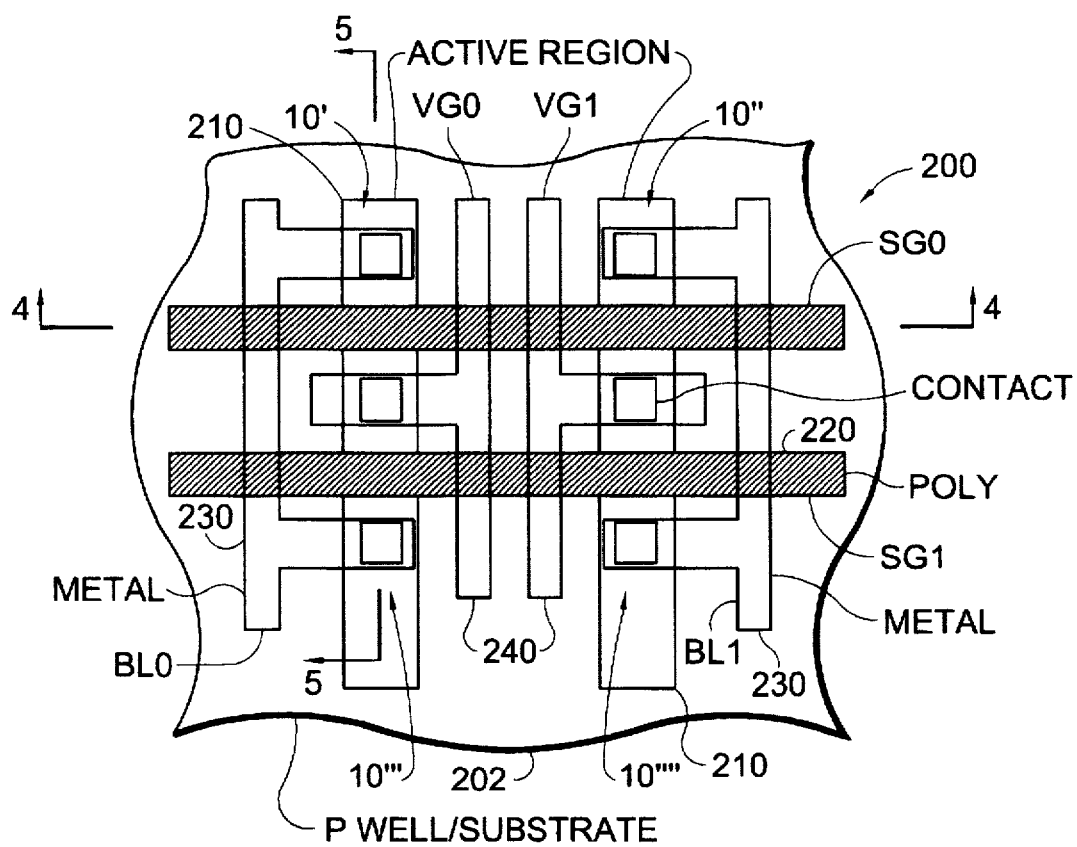
FIG. 3 is a diagram showing a plan view if the internal memory cell array arrangement of a preferred embodiment of the invention according to the schematic shown in FIG. 2.

FIG. 3 shows topographical plan view of an embodiment of a structure of a cell array 200 that has an equivalent electrical schematic diagram represented by the circuit of FIG. 2. Cross sections views of the structure of the array 200 taken at 4—4 and 5—5 are shown in respectively FIGS. 4 and 5. The portion of the array 200 shown has four memory cells 10' to 10'''. A column in cell array 200 is constructed using a single active region 210 formed as a stripe oriented in a first direction. Columns are placed as a plurality of active region stripes 210, oriented substantially parallel to one another, and each separated by field oxide isolation. Rows are constructed in cell array 200 using a deposited poly-silicon gate patterned in substantially parallel stripes 220 oriented in a direction different from the first, and preferably orthogonal to the first. (It should be understood, of course, that although only four cells are shown in the array portion shown in FIG. 3, any number of cells can be employed to form an array of desired size, for example, an array of 256 rows×256 columns to provide a 64K bit memory device.)

The structure 200 is formed on a semiconductor substrate 202, which can be, for example, a p-well formed in a silicon substrate that has been doped with n-type dopant. Cell array 200 incorporates a shared contact between cells within a column to connect cell sources and drains to conductive metal layer virtual ground lines and bit lines, rather than using N+/N− diffused lines the substrate. A plurality of sets of parallel bit lines 230 and virtual ground lines 240 are formed in metal in stripe patterns that connect to diffused source drain junctions through a contact.

Cell array 200 construction does not necessarily provide an area savings over the cell array constructions shown in PCT-2, however, it would be preferably used where process simplicity, or higher performance is desired. The elimination of the buried bitline and the field shield layer shown in PCT-2 reduces the number of process steps and masking layers required to manufacture the cell array 200. Further, since the source and drains of each cell is directly connected to metal lines rather than diffused N+/N− lines, there is far less resistive drop in the virtual ground and bit lines, enabling a higher performance product when array 200 is used.

Cell array 200 could be constructed in a smaller cell size by using a second patterned layer of doped poly-silicon or silicided poly to replace either the metal virtual ground line or the metal bit line. The poly or silicided poly would be patterned to form substantially parallel stripes that would contact the substrate through a buried contact between the second layer of poly and the diffused nodes along active region 210. In this case, the cell size would not be metal pitch limited since only one line would be routed in metal, preferably directly overlaying the active area stripes.

The regions bounded between the active regions 210 provide field oxide isolation regions. The distance between adjacent regions 210 determines the channel length of the field oxide isolation device between memory cells, so this distance is preferably selected in view of programming bias conditions as described below. Likewise the width of the poly stripes 220 determines the channel length of the non-volatile memory devices. The width of the poly is preferably selected in view of read bias and program bias conditions as also described below.

The process flow for forming the cell array 200 is different from that used in the cell arrays shown in CIP-2. The sequence follow the steps listed below. An N-type starting wafer is assumed, building an n-channel memory array. Ranges are supplied for some thicknesses, times and temperatures. These ranges are provided for clarification of function, and not meant to indicate the only acceptable values. Only the processing steps that are required to construct the memory array are included. Other processing steps that are required for integration with other circuit elements and interconnection can be performed in addition to the steps listed below by using techniques that are commonly known by those skilled in the art of integrated circuit processing.

1. P-Well Construction
Oxidation (100–200 Angstroms)
P-Well Photomasking Steps
P-Well Boron Implant
Photoresist Removal
P-Well Drive (1000–1200 degrees C., 2 to 12 hours)
2. Active Region Formation
Clean (Etch to remove 100–200 Angstroms $SiO_2$)
Oxidation (100–200 Angstroms)
Silicon Nitride Deposition (1000–2000 Angstroms)
Active Region Photomasking Steps
Isolation Implant (Boron 1E12-1E14/$cm^2$)

Silicon Nitride Etch (Reactive Plasma Etching)

Photoresist Removal

Oxidation (Wet O2, 900–1000 degrees C., 4000–8000 Angstroms)

Silicon Nitride Removal (Hot Phosphoric)

3. SONOS Cell Construction

Threshold Implant (Boron or Phosphorus $10^{11}$–$10^{12}$/cm$^2$)

Clean (Etch 100–200 Angstroms, Bare Silicon in Cell Channel)

Tunnel Oxide (0–25 Angstroms)

Silicon Oxy-Nitride Deposition (10–300 Angstroms)

Top Oxide Deposition (0–100 Angstroms)

Poly Deposition (2000–5000 Angstroms)

Poly Doping (Phosphorus, Ion Implant $10^{15}$–$5\times10^{16}$/cm$^2$)

Implant Anneal (800–900 Degrees C.)

Poly Photomasking Steps

SONOS Etch (Reactive Plasma Etch)

Photoresist Removal

4. LDD and Spacer Formation

N– Doping (Phosphorus, Ion Implant $10^{13}$–$10^{15}$/cm$^2$)

Deposit Conformal CVD Oxide (1000–4000 Angstroms)

Anisotropic Oxide Etch (Reactive Plasma Etch to Substrate)

Clean

N+ Doping (Arsenic, Ion Implant $10^{15}$–$2\times10^{16}$/cm$^2$)

Implant Anneal (800–900 degrees C.)

Oxidation (100–500 Angstroms)

5. Pre-Metal Dielectric and Contact Construction

Deposition (BPSG, 3000–8000 Angstroms)

Densification and Flow (800–900 degrees C.)

Contact Photomasking Steps

Contact Etch (Reactive Plasma Etch to Substrate)

Photoresist Removal

6. Metal Layer Formation

Clean (with 100–300 Angstroms etch of oxide)

Metal Deposition (1000 Angstroms TiN, 4000 Angstroms Aluminum)

Metal Photomasking Steps

Metal Etch (Reactive Plasma Etch to Pre-Metal Dielectric

Photoresist Removal

Figure 4:
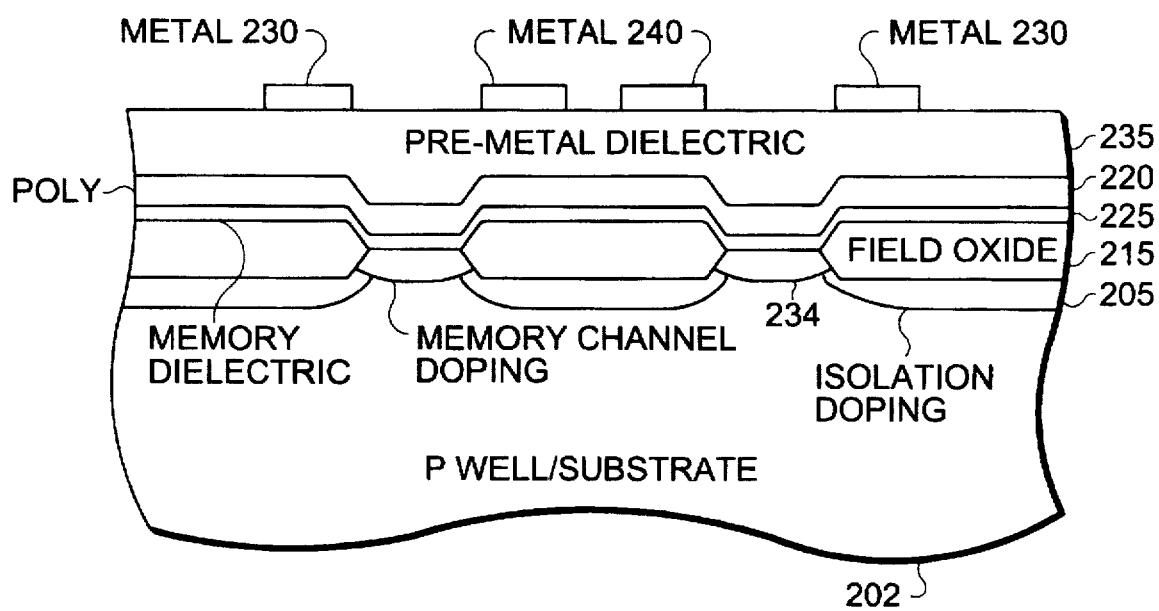
FIG. 4 is a diagram showing the enlarged cross-sectional view of the memory cell array taken along the line 4—4 of FIG. 3.

After the oxidation mask of Silicon Nitride is deposited and patterned in photoresist, an Isolation Implant is provided to increase the threshold voltage of the Field Oxide isolation device in the Isolation Doping regions 205. The photoresist pattern is etched into the Silicon Nitride and the Field Oxide layer 215 is grown in areas not protected by the patterned Silicon Nitride as best seen in FIG. 4. The protected areas for the Active Regions 210 once the Silicon Nitride mask is removed.

A Threshold Implant 234 lightly dopes the Active Regions 210 in order to set the threshold voltage of the nonvolatile memory devices. After a clean, the SONOS layers are formed by growing the tunnel oxide in the Active Regions 210, depositing the oxy-nitride memory dielectric 225, depositing a top oxide on top of the memory dielectric 225, depositing a poly-silicon layer, the finally doping the poly layer. A photomask and etch process is used to pattern the poly layer 220 along with the memory dielectric 225 in a self-aligned manner.

Figure 5:
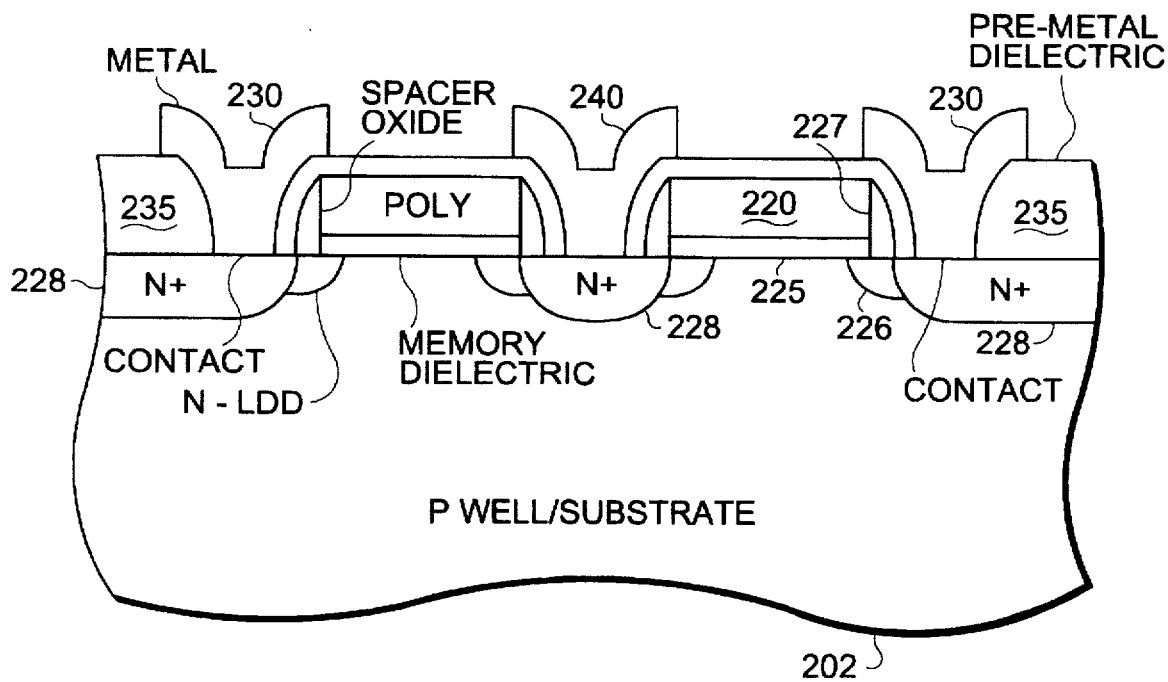
FIG. 5 is a diagram showing the enlarged cross-sectional view of the memory cell array taken along the line 5—5 of FIG. 3.

The Lightly Doped Drains (LDD) and Spacer are formed by first implanting the entire surface with phosphorus to form the self-aligned LDD 226 as best seen in FIG. 5. Then sidewall spacers 227 are formed in a self-aligned manner by depositing and etching an SiO2 layer. Finally, the N+ drain regions 228 are formed by a self-aligned implant.

The array structure is completed using conventional processing techniques to form contacts and metal interconnect. A BPSG Pre-Metal Dielectric 235 is deposited and heat treated to densify and flow the glass to form a relatively smooth topography. Contacts are formed using a photomask and etch process, followed by a deposition, pattern and etch of the metal layer to form bitlines 230 and virtual ground source lines 240.

The spacing between Active Regions 210 is formed of a field oxide isolation device. The distance between adjacent Active Regions 210 in adjacent cells determines the channel length of the isolation device between memory cells, and so this distance is selected under programming bias considerations. During a program operation the row gate is at the program potential of Vcc. A worst case situation occurs when every other cell is being inhibited along a selected row during program. The voltage between adjacent Active Regions in different cells can be as high as Vcc–Vpp when using a full inhibit bias or as low as (Vcc+Vpp)/2 when using a partial inhibit bias. The maximum allowed leakage current generated from such a selected row should be ~10 times less than what can be supplied from the Vpp source.

This isolation spacing can be reduced for a given product array architecture by increasing the Isolation Doping 205 concentration beneath the Field Oxide 215, increasing the thickness of the Field Oxide, and/or reducing the junction depth of 226 and 228 in the Active Regions 210. These changes in doping concentration and junction depth will produce the adverse effect of reducing the breakdown voltage of the junction, which in turn increases the leakage current on biased N+/N– junctions 226 and 228. Also increasing the Field Oxide 215 thickness adversely affects the cell size, so the space cannot be minimized to zero. A minimum isolation space for a given product array architecture can be achieved, however, by adjusting the three parameters to optimally achieve the maximum allowed leakage current (Isolation Doping 205 concentration, Field Oxide 215 thickness, depth of Junctions 226 and 228).

The width of the poly lines within a cell determine the channel length of the memory device. The channel length is set with concern for read deselect bias conditions. The leakage current of concern during read operation is between source and drains of deselected cells along each column. The maximum allowed leakage current on any column is selected to be ~100 times less than the maximum current that can be sensed as a program state while still achieving product level performance specifications, such as data access time. With this criteria, mis-sensing a program state cell as an erased state cell is avoided. The maximum allowed leakage current between lines on a column occurs when all deselected cells on that column are in the freshly erased state. The channel length of memory devices are selected to achieve the maximum allowed leakage current described above.

The memory device channel doping and non-volatile dielectric thickness are, for the most part, selected using criteria unrelated to leakage current and so are typically not adjusted to minimize leakage. The N+/N– junction depth can be reduced to minimize the channel length, however, such a reduction is limited by junction breakdown, as discussed above. Thus, the channel length is the first order parameter used to achieve the maximum allowed leakage.

Figure 6:
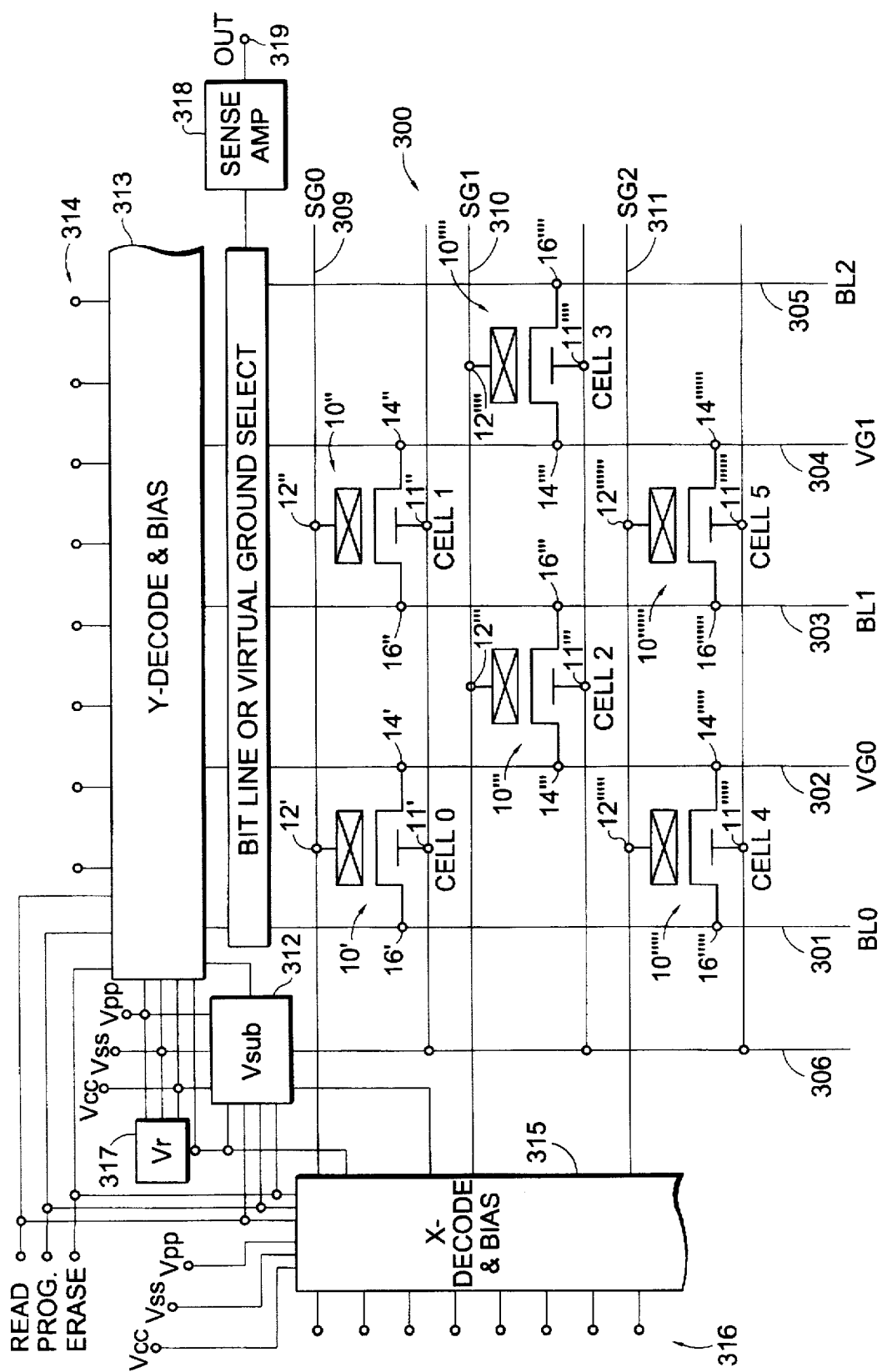
FIG. 6 schematically shows the overall circuit arrangement of the memory circuit according to another preferred embodiment of the invention.

FIG. 6 shows yet another arrangement using cell 10 in a plurality of columns and rows of identical cells (10', 10", 10"", 10''"", 10'""", 10""""') to form a cell array 300 to construct a high density memory product, such as a one or sixteen megabit flash memory device, or the like. The drawings illustrate a 3×2 array 300, but such figures are not intended to limit the number of cells 10 possible in an array 300.

As schematically shown in FIG. 6, the cells 10', 10" and 10'"" are connected at the source nodes 14', 14" and 14'"" to the virtual ground line 302, designated VG0; and the source nodes 14", 14"" and 14"""" of cells 10", 10"" and 10"""" are connected to the virtual ground line 304, designated VG1. Likewise, the drain nodes 16", 16'" and 16""" of cells 10", 10'" and 10""""' are connected to the bit line 303, designated BL1, drain nodes 16' and 16"" of cells 10' and 10'"" are connected to bit line 301 (BL0), and drain node 16"" of cell 10"" is connected to bit line 305 (BL2). All cells within the array "share" a common substrate line 308 which is powered by 312 the Vsub Decode and Bias generator. The cells 10' and 10" share a common gate line 309 (SG0), cells 10'" and 10"" share a common gate line 310 (SG1), and cells 10'"" and 10""""' share a common gate line 311 (SG2).

Simply stated, the substrate nodes 11 among an array or an array segment of cells 10 are all "shared" on a common node; the drain nodes 16 and source nodes 14 are "shared" among cells 10 within columns; common source nodes 14 within columns are further "shared" with common source nodes 14 of a first adjacent columns; and common drain nodes 16 within columns are further "shared" with common drain nodes 16 of a second adjacent columns.

On the other hand, cells 10 with "shared" or common drain nodes 16 and source nodes 14 have separates gate nodes 12 permitting a single addressed cell 10 to programmed or read. Gate nodes 12 on every other first alternate columns are "shared" among the cells 10 in every other first alternate rows; and gate nodes 12 on every other second alternate columns are "shared" among the cells 10 in every other second alternate rows. Since the source nodes 14 and drain nodes 16 are not "shared" among cells 10 in any row, independent control of source and drain lines within a row is possible, permitting unaddressed cells to be actively deselected for elimination of high currents and "disturbed" cells during read and program operations.

The bit lines BL0, BL1, BL2, . . . and virtual ground lines VG0, VG1, . . . of the individual cells 10'—10"""" are addressed by signals from a Y-decoder 313, which decodes address signals applied to an input address bus 314. In like manner, the gate lines SG0, SG1, SG2, . . . are addressed by signals from an X-decoder 315, which decodes address signals applied to an input address bus 316. The X- and Y-decoders 315 and 313 each receive a read voltage Vr, from source 317, a supply voltage Vcc, a reference potential Vss, and a programming voltage Vpp, for selective application to the respective bit, virtual ground, gate lines, and substrate of the array 300, as well as read, erase, and program control signals to specify the particular function to be performed and voltage levels to be selected and applied. The substrate of array 300 is selected by the X- and Y-decoders and biased by Vsub Decode and Bias Generator 312, thus allowing a plurality of arrays 300 to be decoded within one circuit. The construction of the voltage source Vr 317 can be a voltage divider, band gap, or other similar circuit. The control signals and addresses can be applied to the X- and Y-decoders internally or externally from the integrated circuit chip on which the array is constructed, in a manner know in the art. The current produced on either the bit lines BL0, BL1, BL2, ... or the virtual ground lines VG0, VG1 . . . is sensed by a sense amplifier 318, for delivery to an output terminal 319. The sense amplifier 318 can be of any known suitable type.

Table 3 below describes a preferred operation of the cell array 300 shown in FIG. 6.

TABLE 3

| NODE | Read Cells 2&3 Read Deselect Cells 0,1,4,5 | Erase Cells 2&3 Erase Deselect Cells 0,1,4,5 | Erase Inhibit Cells 0,1,4,5 Erase Deselect Cells 2,3 | Program Cell 2 Inhibit Cell 3 Deselect Cells 0,1,4,5 |
|---|---|---|---|---|
| Substrate (P-Well) | $V_{ss}$ | $V_{cc}$ | $V_{pp} + V_r$ | $V_{pp}$ |
| SG0 | $V_{ss}$ | $V_{cc}$ | $V_{cc}$ | $V_{pp}$ |
| SG1 | $V_r$ | $V_{pp} + V_r$ | $V_{pp} + V_r$ | $V_{cc}$ |
| SG2 | $V_{ss}$ | $V_{cc}$ | $V_{cc}$ | $V_{pp}$ |
| BL0 | $V_{cc}$ | $V_{cc}$ | $V_{cc}$ | $V_{cc}$ |
| VG0 | $V_r$ | Float | Float | Float |
| BL1 | $V_{cc}$ | $V_{cc}$ | $V_{cc}$ | $V_{pp} + V_r$ |
| VG1 | $V_r$ | Float | Float | Float |
| BL2 | $V_{cc}$ | $V_{cc}$ | $V_{cc}$ | $V_{cc}$ |

The cell array 300 can be read by sensing a current either on the bit line 301, 303, 305 or on the virtual ground line 302, 304 by known sensing techniques. If an erased device has a negative threshold voltage with its gate and source potential at $V_r$, established as described above, the erased device will be on and conducting current.

The cell array 300 enables a read system that allows a selection of individual cells 10 within a column of common cells 10 without causing a "disturb" condition. As described above, a "disturb" condition occurs when an electric field that is at a polarity that changes the state of the cell occurs between a gate and the device channel or substrate. A read deselect bias system allows the active "deselection" of individual unaddressed cells within a column of common cells without causing a "disturb" condition.

A group of cells in the array 300 can be Erased by biasing a gate, such as 12'" to (Vpp+Vr), while the array substrate bias is at Vcc, erasing all of the cells on gate line 310. The reason for selecting (Vpp+Vr), rather than simply Vpp is best seen under a program operation, as discussed below. Rows can be deselected during the Erase operation by biasing the common gates to Vcc, such as shown for rows SG0 (309) and SG2 (311) above in Table 3. Since the gate to substrate potential is zero on deselected gates during an Erase operation, no "disturb" condition results. The combination of bias condition within the array is called an Erase/Erase Deselect Operation.

A group of cells in the array 300, within one P-well or substrate, which share common row line gates with a second group of cells in array 300, within a separate P-well or substrate, can be Erase Inhibited and Erase Deselected while the second group is in an Erase/Erase Deselect Operation. The P-well or substrate of the first group is placed at Vpp +Vr rather than Vcc and all other biases remain the same as within the Erase/Erase Deleselect Operation group. The row which was under an Erase bias in the second group will be under an Erase Deselected bias in the first group without disturb, since the potential on the gate 12 is the same as that on the substrate 11, such as shown on SG1 (310) above in Table 3 and FIG. 6. The rows which are under Erase Deselect bias in the second group, such as SG0 (309) and SG2 (311), will be in an Erase Inhibit bias in the first group without disturb, since the drains 16 (and thus the transistor channels) are at Vcc. An inversion region channel will form in erased devices on Erase Inhibited rows. The inversion channel potential will be Vcc within these erased cells, preventing a disturb since the gates are also at Vcc. Programmed cells on the Erase Inhibited rows will not form an inversion channel, but will form a depletion layer beneath the gate. The voltage drop across the memory dielectric will be minimized, and will be of a polarity to reinforce the programmed state, rather than create a "disturb" condition.

Program conditions can be established on a common gate, and inhibited in all cells on the common gate except those for which a programmed state is desired. A program condition can be established by biasing the substrate or P-well at Vpp and placing a common gate at Vcc (such as SG1 on Cells 2 and 3). If certain cells on the common gate are to be programmed, then the bit lines of those cells are biased at Vpp +Vr (such as in Cell 2). A bias of Vpp+Vr is used rather than simply Vpp in order to prevent leakage to the Virtual Ground common source lines through erased devices on adjacent rows (such as through Cells 1 and 5). If an erased state is to be preserved in any of the cells on the common gate, then the bit line of those cells is biased at Vcc (such as in Cell 3). This bias is called a Program Inhibit Operation.

Further, a partial inhibit voltage typically no lower than (Vcc+Vpp+Vr)/2, can be placed on the bit line during a Program Inhibit Operation instead of Vcc as long as the array operation does not require a substantial number of program inhibit operations. Since the partial inhibit voltage will slightly disturb the erase state, only a limited number of partial inhibit operations can be used, otherwise the erase state threshold voltage will be significantly reduced. A partial inhibit is useful when a using full row erase and full row program operations. Here the inhibit only occurs once. However, a partial inhibit may not be as useful when the row is erased on a full row basis but written on a byte basis, nor when the array is segmented by P-wells allowing both byte erase and byte program along a given row. In the first case the number of partial inhibits a cell can see is equal to the number of bytes on the row, and so a partial inhibit can be designed to work properly given a limited number of bytes and a selectable inhibit voltage. However, in the second case, there is virtually an unlimited number of Program Inhibits a cell can see, so a partial inhibit is not very useful.

Figure 7:
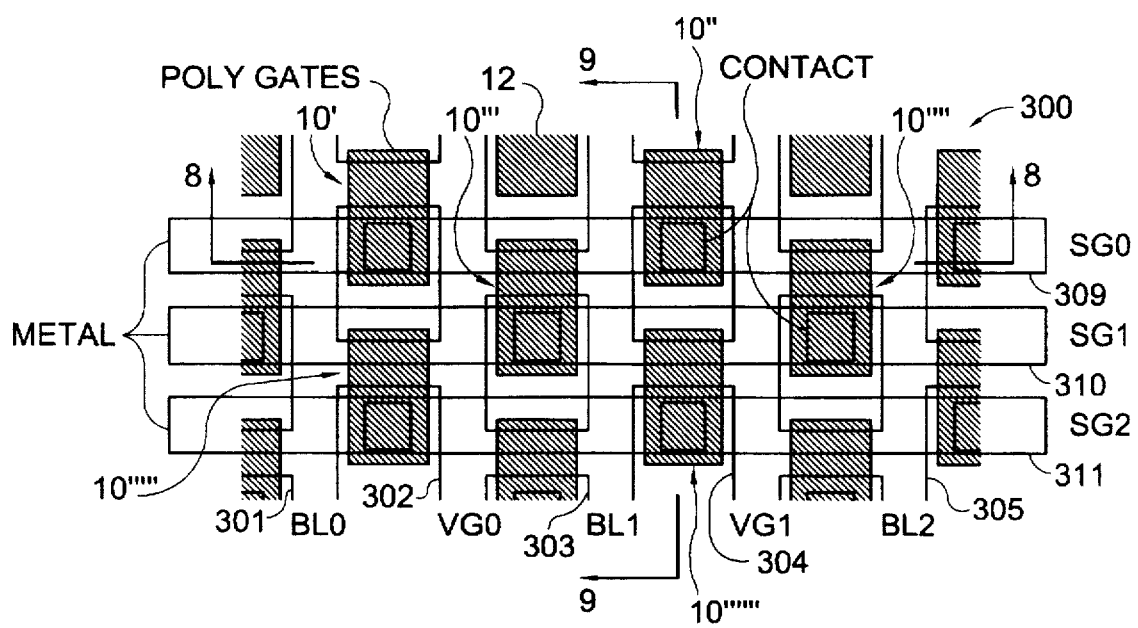
FIG. 7 is a diagram showing a plan view if the internal memory cell array arrangement of a preferred embodiment of the invention according to the schematic shown in FIG. 6.
Figure 8:
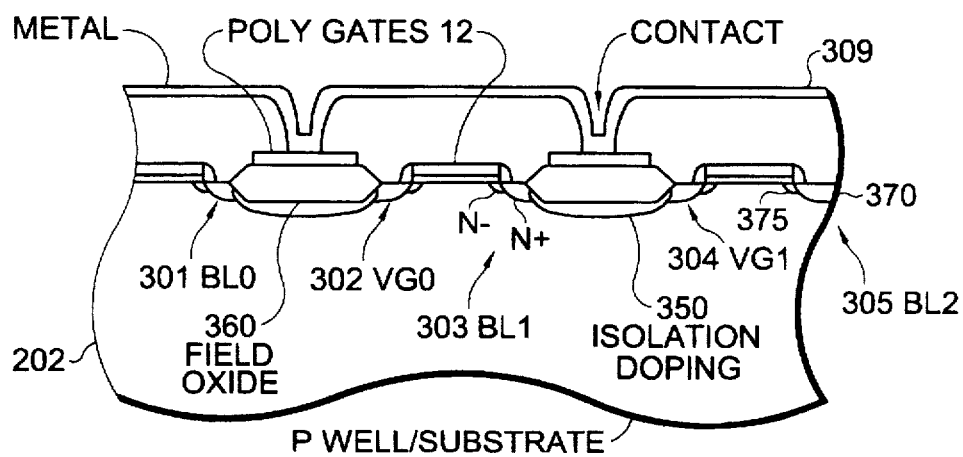
FIG. 8 is a diagram showing the enlarged cross-sectional view of the memory cell array taken along the line 8—8 of FIG. 7.
Figure 9:
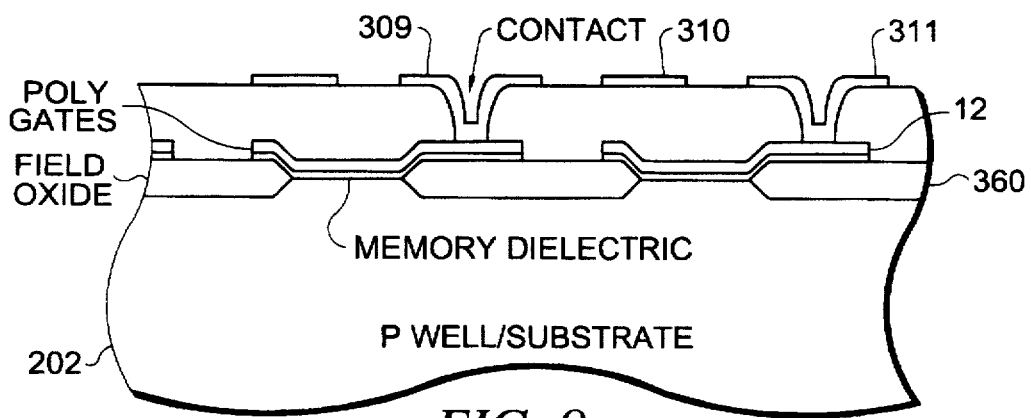
FIG. 9 is a diagram showing the enlarged cross-sectional view of the memory cell array taken along the line 9—9 of FIG. 7.

FIG. 7 shows topographical plan view of an embodiment of a structure of a cell array 300 that has an equivalent electrical schematic diagram represented by the circuit of FIG. 6. Cross sections views of the structure of the array 300 taken at 8—8 and 9—9 are shown in respectively FIGS. 8 and 9. The portion of the array 300 shown has six memory cells 10' to 10"'''. Unlike cell array construction shown in FIG. 3, cells in array 300 are constructed with an isolated single poly gate which are connected in common by a plurality of substantially parallel metal row lines, oriented in a first direction. Columns are placed as a plurality of active regions which form common bitlines and virtual ground source lines, oriented substantially parallel to one another and in a second direction different, and preferably orthogonal to the first. The active regions of each column is shared with those of adjacent columns. Within a column, transistor channel regions are separated from one another by use of a field oxide isolation device.

The structure shown in FIG. 7 above is formed on a semiconductor substrate using the same processing steps shown above for the structure in FIG. 3.

The regions bounded between the active regions provide field oxide isolation regions. The distance between adjacent active regions determines the channel length of the field oxide isolation device between memory cells and between bitlines and virtual ground lines, so this distance is preferably selected in view of programming bias conditions.

The spacing between Active Regions that form the bitlines and virtual ground lines determines the channel length of the isolation device, and so this distance is selected under programming bias considerations. During a program operation the row gate is at the program potential of Vcc. A worst case situation occurs when every other cell along is being inhibited along a selected row during program. The voltage between adjacent Active Regions in different cells can be as high as Vcc−Vpp when using a full inhibit bias or as low as (Vcc+Vpp)/2 when using a partial inhibit bias. The maximum allowed leakage current generated from such a selected row should be ~10 times less than what can be supplied from the Vpp source.

This isolation spacing can be reduced for a given product array architecture by increasing the Isolation Doping 350 concentration beneath the Field Oxide 360, increasing the thickness of the Field Oxide, and/or reducing the junction depth of 370 and 375 in the Active Regions. These changes in doping concentration and junction depth will produce the adverse effect of reducing the breakdown voltage of the junction, which in turn increases the leakage current on biased N+/N− junctions 370 and 375. Also increasing the Field Oxide 360 thickness adversely affects the cell size, so the space cannot be minimized to zero. A minimum isolation space for a given product array architecture can be achieved, however, by adjusting the three parameters to optimally achieve the maximum allowed leakage current (Isolation Doping 350 concentration, Field Oxide 360 thickness, depth of Junctions 370 and 375).

Likewise the width of the poly gates 12 determines the channel length of the non-volatile memory devices. The width of the poly is preferably selected in view of read bias and program bias conditions. The width of the poly lines within a cell determine the channel length of the memory device. The channel length is set primarily with concern for program bias conditions. As described above the worst case program situation occurs when every other cell along is being inhibited along a selected row during program. The voltage between adjacent Active Regions in different cells can be as high as Vcc−Vpp when using a full inhibit bias or as low as (Vcc+Vpp)/2 when using a partial inhibit bias.

The memory device channel doping and non-volatile dielectric thickness are, for the most part, selected using criteria unrelated to leakage current and so are typically not adjusted to minimize leakage. The N+/N− junction depth can be reduced to minimize the channel length, however, such a reduction is limited by junction breakdown, as discussed above. Thus, the channel length is the first order parameter used to achieve the maximum allowed leakage.

Figure 10:
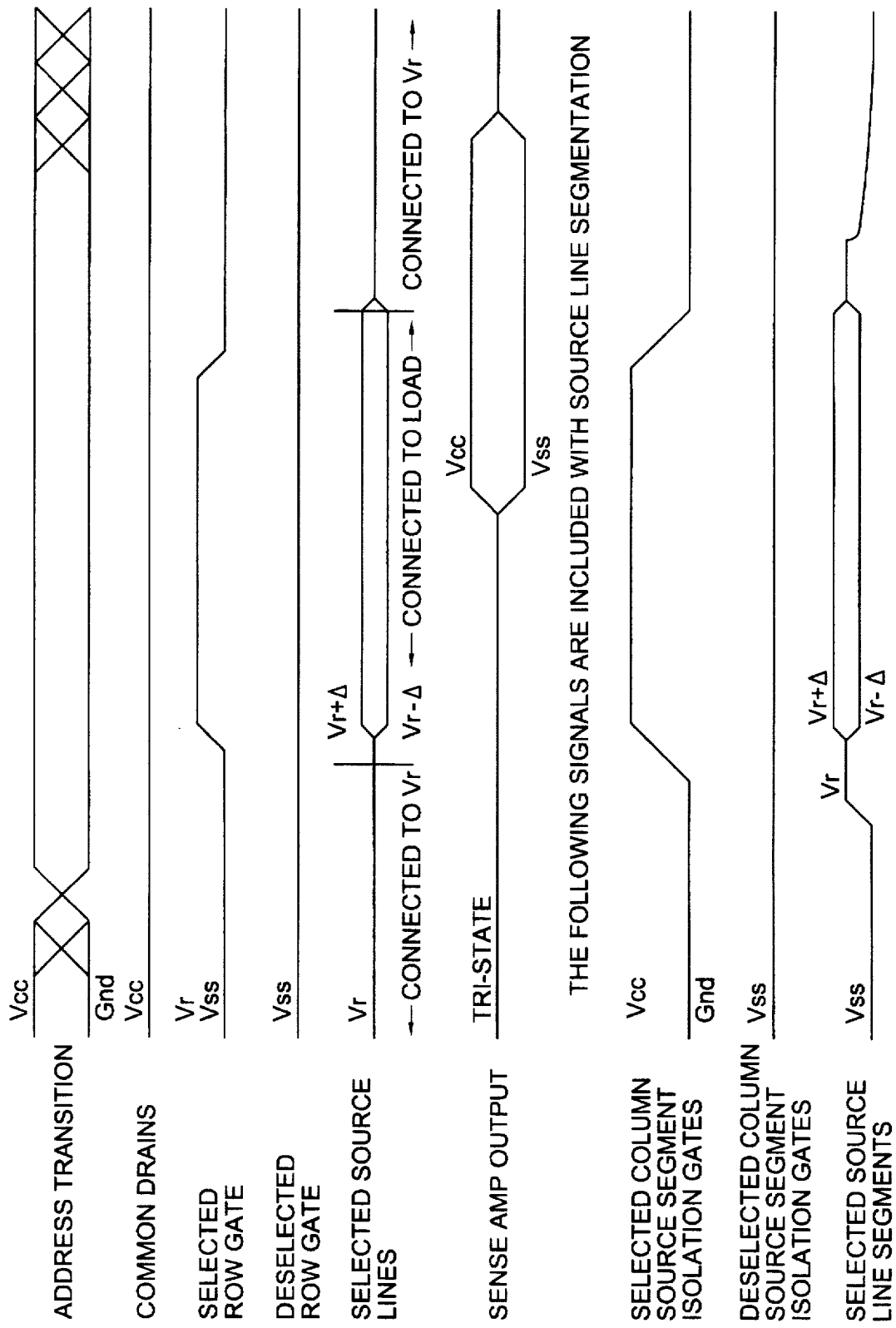
FIG. 10 illustrates the wave forms of main electrical signals appearing in main portion of the memory circuits having the schematics of FIG. 2 and FIG. 6 during a read operation.

A method for sensing the state of cells along a row is provided here and diagrammed in FIG. 10, by measuring the effect of cell channel current on the virtual ground source side. While address transitions are occurring, all row gates are held at Vss, all source lines are connected through a common gate transistor to Vr, all drain lines are connected to Vcc, either directly or through internal supply paths, and the output of the sense amplifier is in a tri-state condition. After a predetermined delay from the last address transition in a sequence of such transitions, the source lines are disconnected from Vr by turning off the common gate transistor between the source lines and the Vr supply line. Then the selected row gate voltage is ramped to Vr, and at about the same time, the input lines to sense amplifiers are connected to the selected sources along with a load which serves to reduce the source voltage in the absence of other currents. This load can be either a static or dynamic load in the form of a current sink or a capacitor precharged to a potential less than Vr. Biasing the selected row gate to Vr will turn on erased devices and leave off programmed devices. If a selected device on the row is erased, the cell will conduct current and the source line potential will rise toward Vcc. If a selected device on the row is programmed, the cell will conduct no current and the source line potential will fall from Vr due to the load. The state of the selected cells can then be determined by comparing the source line potential to Vr in the sense amplifier and amplifying the differential to either Vcc or Vss, depending on the polarity of the differential. Once the sense amplifier state is latched, the selected row gate potential is reduced back to Vss, shutting off all memory cell devices and then the source lines can be reconnected to the Vr line through the common gate transistor.

The time involved in developing a measurable potential difference on the selected source lines will depend on the amount of resistance and capacitance on the source lines. If an array of cells is very large it is preferable to segment the source line into small segments and selectively connect the desired source segment to a highly conductive, low capacitance metal source line during a read operation. With this method, a segment select device connects the selected floating source segment to the metal source line prior to disconnecting the source lines from the Vr line. The segment select potential will become equal to Vr and then the sensing sequence described above can proceed. After the data is latched, the selected row potential is returned to Vss, and the source lines are reconnected to the Vr line, the segment select device is turned off by bringing its gate potential back to Vss. The source segments will once again be floating and their potential will gradually decay toward Vss.

A problem of the single poly cell structure embodiment described in FIG. 3 is that the need for spaces between the metal bitlines and virtual ground lines, as well as a minimum width required for the metal lines themselves, requires a large amount of space in the row dimension, thus making the cells area quite large. One solution to this problem it to place one of either the bitlines or the virtual ground lines in a lower layer conductor such as a second level of poly. By removing half the lines in the metal layer, the row dimension can be reduced significantly. However, this approach is somewhat costly due to the addition of a second layer of poly along with a means of providing a buried contact between the second layer of poly and the active region.

Because of the cost of using such approaches, a third approach we have used is to build buried diffused bitlines and virtual ground lines in the substrate with a single poly technology where the word lines are in poly (or silicided poly) and the bitlines are in metal. The bitlines and virtual ground lines are separated by a form of LOCOS isolation and the diffused lines are formed after the isolation if formed. This approach eliminates the need for an additional layer of poly and a buried contact, and further provides for a smaller cell. However, the need to compensate for misalignment between the LOCOS isolation pattern and the diffused lines layer increases the row dimension by about 25-30% over what can be achieved in a fully self-aligned scheme. Such a fully-self aligned scheme is shown in USPTO patent application serial number 8-234228, however, this approach uses two layers of poly, one for the word lines and another for a field-shield isolation.

Here we describe a fully self-aligned cell that uses buried diffused lines and a single poly technology. This approach realizes roughly the same cell size as enabled by the structure shown in serial number 8-234228, however, replaces the field shield with a LOCOS or oxide isolation and a buried diffused line technology that is self-aligned to the isolation.

The alignment requirement is eliminated by using the isolation mask in conjunction with the buried line mask and a tunnel oxide mask. The buried diffused lines are implanted in a self-aligned manner into the substrates between isolation oxide regions that are not protected by the bitline mask. Oxide in isolation regions is selectively removed with a wet etch where the tunnel oxide will be formed. This sequence and how it removes the need for an alignment tolerance are described in more detail below.

Figure 11:
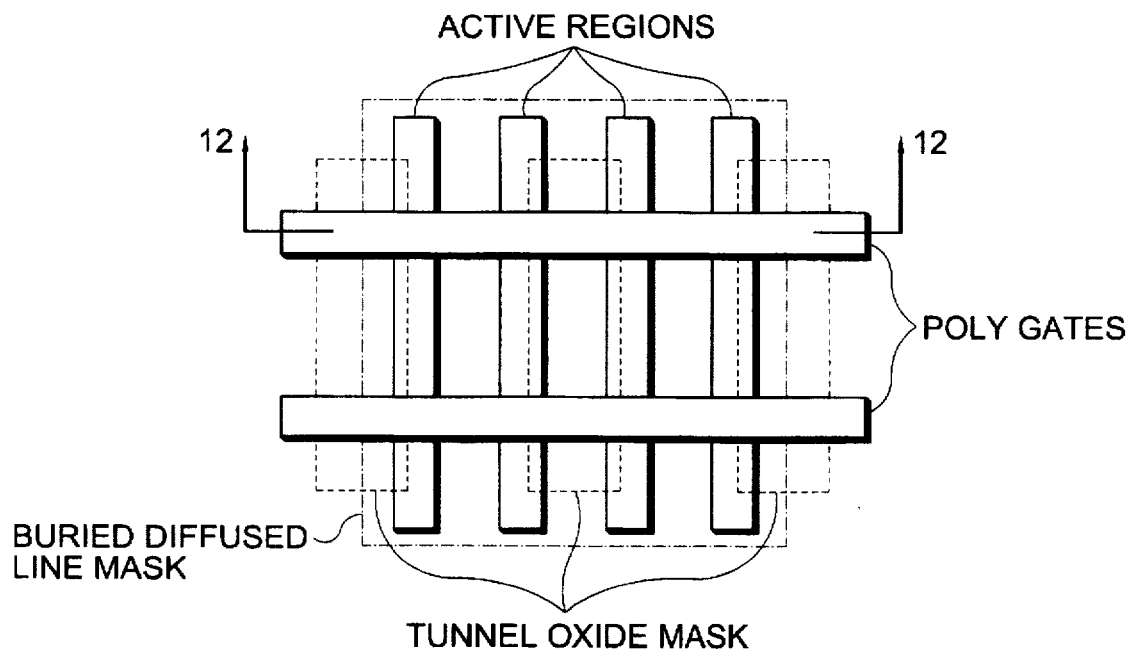
FIG. 11 is a diagram showing a plan view if the internal memory cell array arrangement of a preferred embodiment of the invention according to the schematic shown in FIG. 2.

A top view of this memory cell is shown in FIG. 11 below. The rows are aligned horizontally and the buried diffused lines are aligned vertically. Oxide isolation lies outside all of the Active Regions and can be formed using LOCOS isolation methods or similar techniques. The Tunnel Oxide mask is used to remove the isolation oxide where the tunnel oxide region will be formed for memory devices. The Buried Diffused Line Mask selects Active Regions where the diffused line implants will occur and is otherwise used to block the implants from Active Regions where the impants are not desired, such as P-channel source-drain regions.

Figure 12:
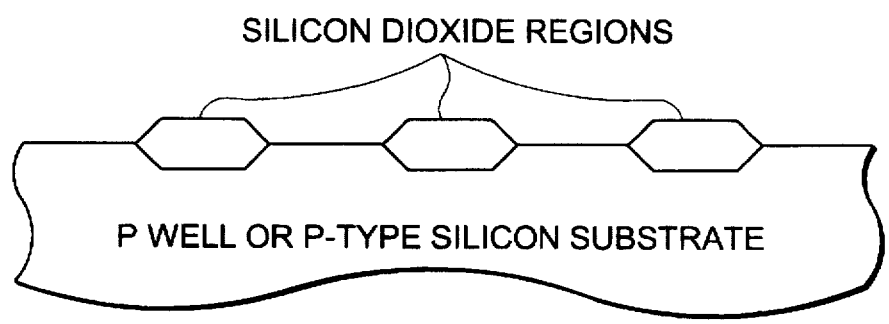
FIG. 12 to 18 are each an explanatory diagram showing the enlarged cross-sectional view of the memory cell array taken along the line 12—12 of FIG. 11 for illustrating an example of a production process of the present invention.

The following sequence of drawings show cryptically how this structure is constructed. FIG. 12 represents a cross section taken at 2—2 of FIG. 11 after the isolation oxide has been patterned and formed. The oxide thickness can be formed using any form of LOCOS processing or oxide region formation process. The oxide thickness will typically be between 3500 and 6000 Å.

Figure 13:
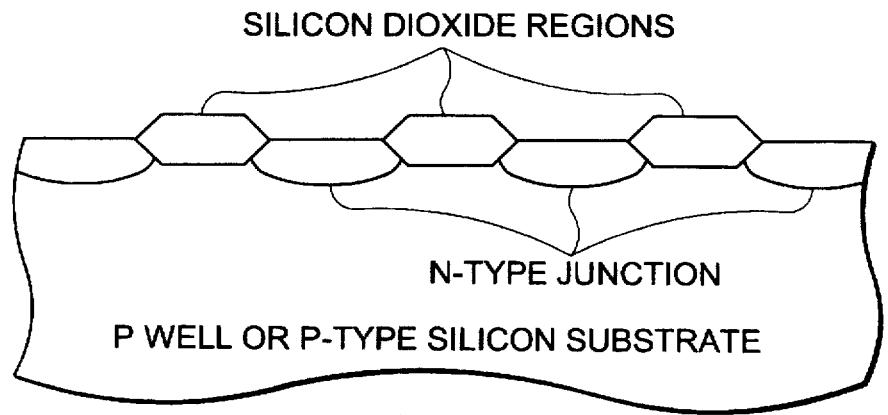

Subsequent to forming the oxide regions the Buried Diffused Lines are formed by use of ion implantation. The implanted species, typically Arsenic and/or Phosphorus, penetrate the silicon substrate in regions not covered by oxide, but are prevented from doing so where the oxide resides. After thermal treatments, junctions form in the substrate between the oxide islands as shown in FIG. 13 below. Preferably the N-type junctions are of a Lightly Dope Drain type or a Doubly Diffused Drain type where the inner portion of the N-type junction is a heavily doped N+ region and the outer portion or the portions adjacent to the oxide regions are lightly doped N–. Techniques for forming such is described in more detail in USPTO application serial number 8-234228 and WIPO PCT application No. PCT/US93/10485.

Figure 14:
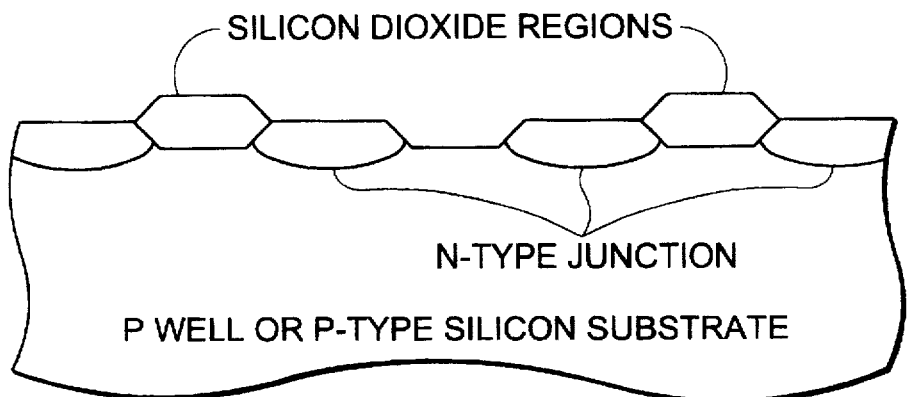

After the implants, the isolation oxide can be selectively removed in the memory channel regions using a masked oxide etch. The Tunnel Oxide mask is used to protect those regions where isolation oxide should remain. This same masking step can be used to selectively implant the channel regions with a threshold adjust implant for the memory devices. FIG. 14 shows the cross section 11 after the isolation oxide has been removed from what will become a memory channel.

Figure 15:
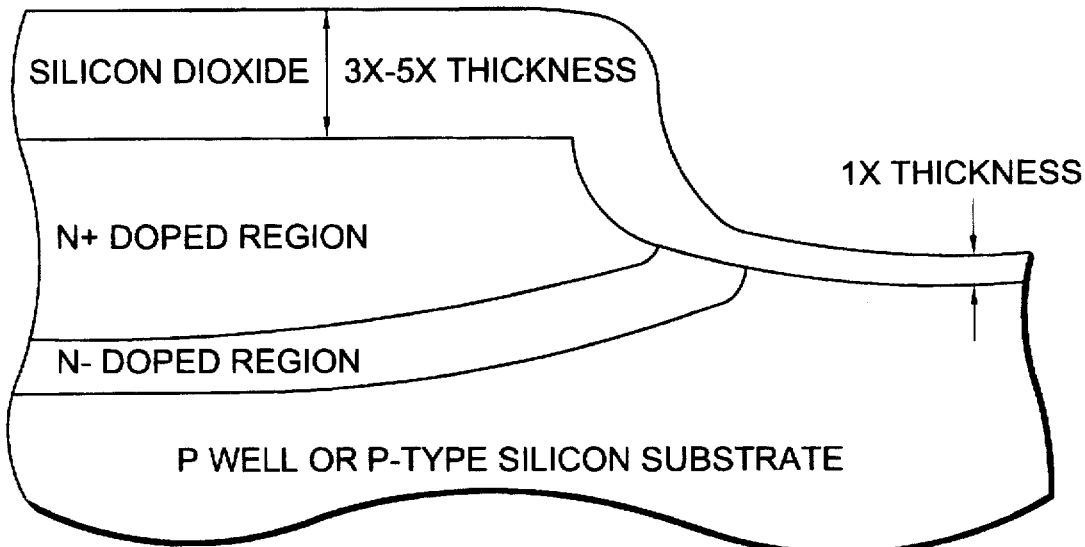

The surface can be oxidized, preferably in an ambient containing H2O, to grow an oxide on the N-type Buried Diffused regions as well as the memory channel regions. The oxide growth conditions such as time, temperature and ambient, are chosen to select an oxide growth rate that is a strong function of the surface reaction rate, rather than limited by diffusion of oxidizing species through the growing oxide. The oxidation rate will then be higher on the N-type regions and non-(100) oriented surfaces than in the undoped (100) surface regions. Thus, the growth rate will be high over the Buried Diffused regions and the edges of the channel regions compared to the normal rate in the bottom of the memory channel regions. The differential rate can be as high as three to five (3–5) times higher over the Buried Diffused Lines than in the memory channel regions. At the edges of the junction on the surface, the oxidation rate will reduce as the surface doping decreases from its highest value to the substrate concentration. An example of the oxide thickness in this region is shown in FIG. 15 below.

Figure 16:
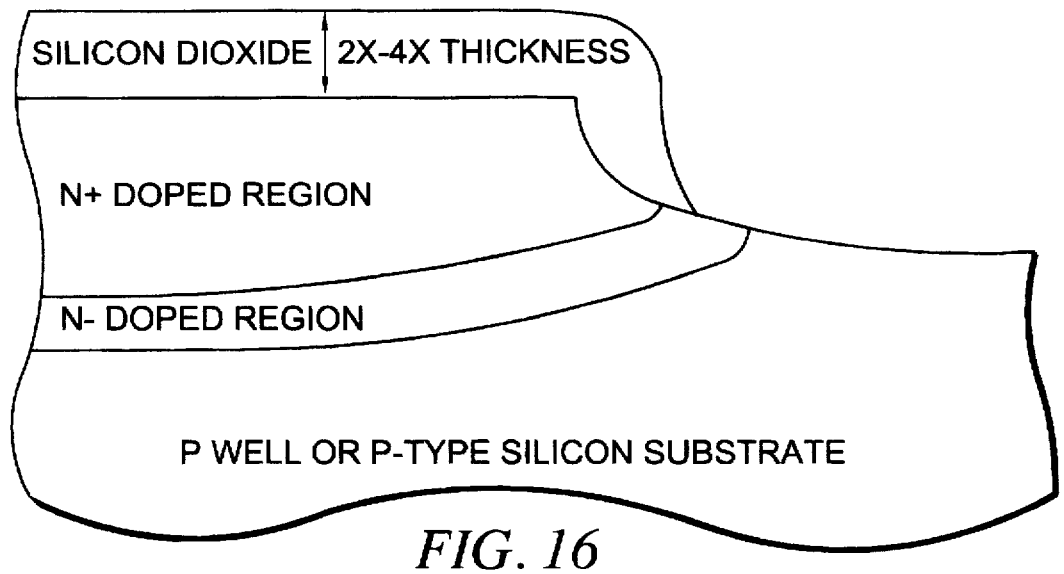

Following the oxidation, a wet chemical etch is performed to remove the Oxide by an amount equal to the thickness in the channel region. This will clear the channel region and thin the oxide outside this region. Ideally, the oxide will taper down to zero thickness in the region where the junction doping decreases, but not at the actual junction itself. This will ensure electrical continuity is maintained between the Buried Lines and the memory Channel as shown in FIG. 16.

Figure 17:
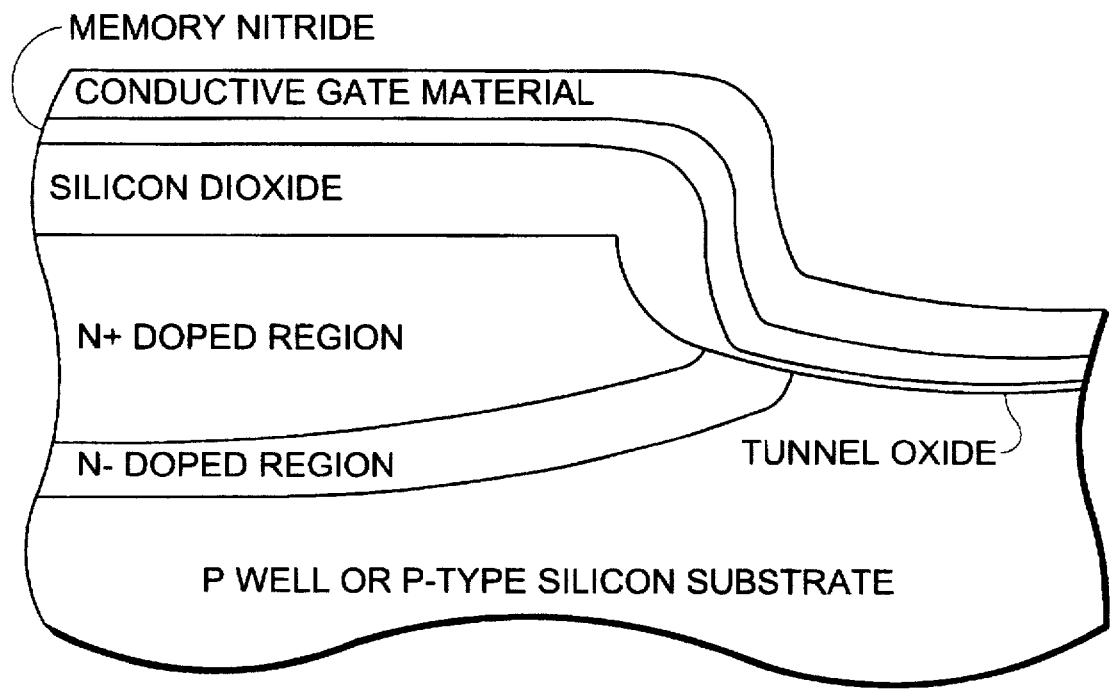

Following these steps, the non-volatile dielectrics can be formed and patterned in a self-aligned manner with a conductive gate as shown in cross section in FIG. 17 when using a SNOS non-volatile dielectric.

The conductive gate material can be doped polysilicon, silicided polysilicon, a metal or any other conductive material. An implant can be used prior to the formation of the Tunnel Oxide to adjust the threshold voltage of the memory channel, typically of dose 1E11–5E12/cm2 Boron, Arsenic or Phosphorus).

Figure 18:
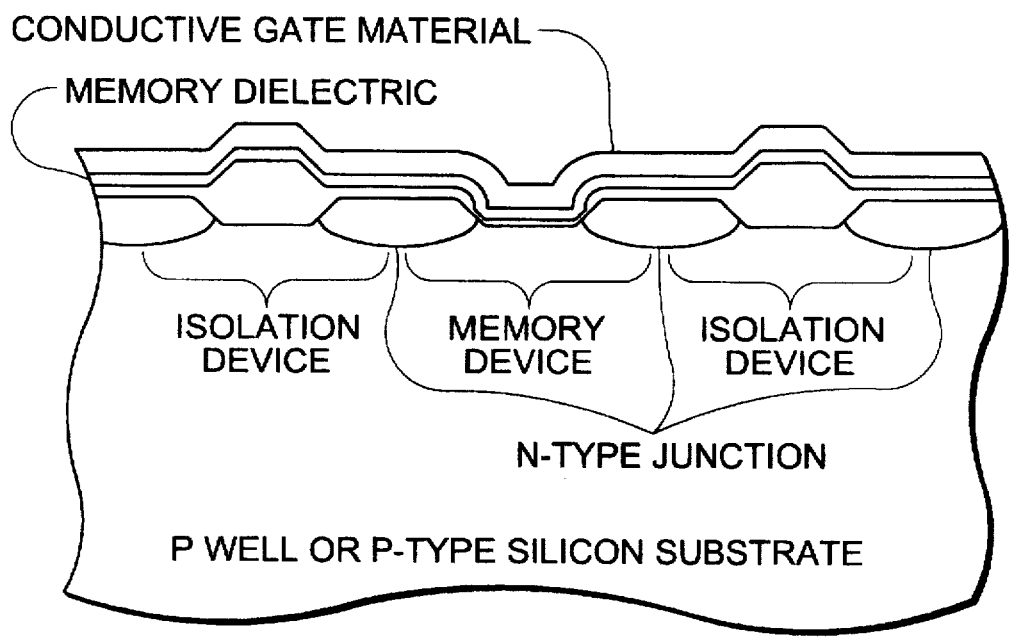

The cross section 2—2 would now appear as shown in FIG. 18 below. The memory dielectric and the conductive gate span the total distance of the cross section 2—2, however, these layers are not continuous over the surface, but patterned to form nearly parallel rows as shown in FIG. 11 above.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. A non-volatile semiconductor device comprising:
  a semiconductor substrate;
  a plurality of substantially parallel bit lines arranged in a first direction on said substrate;
  a plurality of substantially parallel virtual ground lines arranged in a first direction on said substrate, each paired with one of said bit lines to form bit line/virtual ground line pairs;
  a plurality of substantially parallel word lines arranged in a second direction on said substrate substantially orthogonally to said first direction, said word lines being insulated from said bit lines and virtual ground lines;
  at least one memory cell section of an array of memory cells, each comprised of a single programmable memory transistor, and one memory cell residing at the each intersection of said word lines with said bit line/virtual ground line pairs;
  programmable memory transistors having a source, a drain, a gate, and a charge storage layer that has programmable memory states that produce a depletion threshold voltage of magnitude less than a magnitude of a supply voltage when the memory transistor is erased and a enhancement threshold voltage when the memory transistor is programmed, each having a first connection on a drain end to one of said bit lines and having a second connection on a source end to said virtual ground line associated therewith;
  biasing circuitry for applying selected read biasing voltages to said memory cells including a reference voltage applied to said virtual ground lines of magnitude no greater than the magnitude of said supply voltage and at least equal to the magnitude of said depletion threshold voltage, and a voltage greater than said reference voltage applied to said bit lines;
  and sensing circuitry for sensing a current generated at said memory cell in accordance with the programmable state of said charge storage layer of said addressable memory transistor.

2. The device according to claim 1, wherein said bit line and said virtual ground line comprise a highly conductive metal and said word line comprise at least a polysilicon material.

3. The device according to claim 2, wherein said word line further comprise a metal silicide layer on top of said polysilicon material.

4. The device according to claim 1, wherein said bit line and said virtual ground line materially comprise a semiconductor region in said substrate of the same conductivity type as said source and said drain region and said word line materially comprise a highly conductive metal.

5. The device according to claim 1, wherein said memory transistors comprise SONOS tunneling metal insulator semiconductor field effect transistors.

6. The device according to claim 1, wherein said substrate has a first conductivity type and said source and drain nodes are semiconductor regions of a second conductivity type.

7. The device according to claim 1, wherein said substrate has a first conductivity type and said source and drain nodes are semiconductor regions of a first conductivity type; and wherein said memory cell section further comprises a first well region of a second conductivity type formed in said substrate as to surround said memory stack units.

8. The device according to claim 1, wherein said substrate has a first conductivity type and said source and drain nodes are semiconductor regions of a second conductivity type; and wherein said memory cell section further comprises a first well region of a first conductivity type formed in said substrate as to surround said memory cell section and wherein said device further comprises an additional second well region of the second conductivity type formed in said substrate as to surround at least said first well region.

9. The device according to claim 7, wherein means is provided to connect said substrate to said supply voltage and to connect said first well to a supply reference voltage, during a read operation.

10. The device according to claim 8, wherein means is provided to connect said substrate to said supply reference voltage and to connect said second well to said supply voltage and to additionally connect said first well to said supply reference voltage during a read operation.

11. The device according to claim 1, wherein said biasing circuitry for applying selected read biasing voltages provides means to:
  pre-charge said bit line to a first pre-charge value equal to the supply potential;
  pre-charge said virtual ground lines to a second pre-charge value equal to said reference voltage;
  and selectively bias a pre-determined word line to a potential equal to said reference voltage applied to said virtual ground lines so that current will flow between said source and drain of memory transistors when the memory transistor is erased.

12. The device according to claim 11, wherein said biasing circuitry for applying selected read biasing voltage provides further means maintain said bit line potential at a value substantially equal to the supply voltage and to connect said virtual ground line to a load which serves to decrease said virtual ground line potential from said second pre-charge value toward the supply reference potential in the absence of current from the selected memory cell while said sensing circuitry amplifies the voltage difference between said reference potential and the potential that results on said virtual ground line.

13. The device according to claim 12, wherein said memory cell section further comprises a source segment isolation gate which provides means to selectively pre-charge virtual ground lines to said second pre-charge value in only one memory cell section.

14. A non-volatile semiconductor device comprising:

a semiconductor substrate;

a plurality of substantially parallel bit lines arranged in a first direction on said substrate;

a plurality of substantially parallel virtual ground lines arranged in a first direction on said substrate, each placed adjacent to at least one of bit lines to form an array of alternating bit lines and virtual ground lines which are individually electrically isolated;

a plurality of substantially parallel word lines arranged in a second direction on said substrate substantially orthogonally to said first direction, said word lines being insulated from said bit lines and virtual ground lines;

at least one memory cell section of an array of memory cells, each comprised of a single programmable memory transistor, and one memory cell residing at the each intersection of said word lines with said bit lines;

programmable memory transistors having a source, a drain, a gate, and a charge storage layer that has programmable memory states that produce a depletion threshold voltage of magnitude less than a magnitude of a supply voltage when the memory transistor is erased and a enhancement threshold voltage when the memory transistor is programmed, each said memory cell having a first connection on a drain end to said bit line associated therewith and a second connection on a source end to said virtual ground line, said second connection formed to a virtual ground line placed on a first side of even numbered bit line and to a virtual ground line on an other side of odd numbered bit lines;

biasing circuitry for applying selected read biasing voltages to said memory cells including a reference voltage applied to said virtual ground lines of magnitude no greater than the magnitude of said supply voltage and at least equal to the magnitude of said depletion threshold voltage, and a voltage greater than said reference voltage applied to said bit lines;

and sensing circuitry for sensing a current generated at said memory cell in accordance with the programmable state of said charge storage layer of said addressable memory transistor.

15. The device according to claim 14, wherein said bit line and said virtual ground line materially comprise a semiconductor region in said substrate of the same conductivity type as said source and said drain region and said word line materially comprise a highly conductive metal.

16. The device according to claim 14, wherein said memory transistors comprise SONOS tunneling metal insulator semiconductor field effect transistors.

17. The device according to claim 14, wherein said substrate has a first conductivity type and said source and drain nodes are semiconductor regions of a second conductivity type.

18. The device according to claim 14, wherein said substrate has a first conductivity type and said source and drain nodes are semiconductor regions of a first conductivity type; and wherein said memory cell section further comprises a first well region of a second conductivity type formed in said substrate as to surround said memory stack units.

19. The device according to claim 14, wherein said substrate has a first conductivity type and said source and drain nodes are semiconductor regions of a second conductivity type; and wherein said memory cell section further comprises a first well region of a first conductivity type formed in said substrate as to surround said memory cell section and wherein said device further comprises an additional second well region of the second conductivity type formed in said substrate as to surround at least said first well region.

20. The device according to claim 18, wherein means is provided to connect said substrate to said supply voltage and to connect said first well to a supply reference voltage, during a read operation.

21. The device according to claim 19, wherein means is provided to connect said substrate to said supply reference voltage and to connect said second well to said supply voltage and to additionally connect said first well to said supply reference voltage during a read operation.

22. The device according to claim 14, wherein said biasing circuitry for applying selected read biasing voltages provides means to:

pre-charge said bit line to a first pre-charge value equal to the supply potential;

precharge said virtual ground lines to a second precharge value equal to said reference voltage;

and selectively bias a pre-determined word line to a potential equal to said reference voltage applied to said virtual ground lines so that current will flow between said source and drain of memory transistors when the memory transistor is erased.

23. The device according to claim 22, wherein said biasing circuitry for applying selected read biasing voltage provides further means maintain said bit line potential at a value substantially equal to the supply voltage and to connect said virtual ground line to a load which serves to decrease said virtual ground line potential from said second pre-charge value toward the supply reference potential in the absence of current from the selected memory cell while said sensing circuitry amplifies the voltage difference between said reference potential and the potential that results on said virtual ground line.

24. The device according to claim 22, wherein said memory cell section further comprises a source segment isolation gate which provides means to selectively pre-charge virtual ground lines to said second pre-charge value in only one memory cell section.

25. A semiconductor memory device comprised of:

semiconductor substrate;

an array of addressable MIS transistors arranged in rows and columns comprising a plurality of substantially parallel stripes oriented in a first direction in the surface of said substrate, said stripes comprising a dielectric region on said semiconductor substrate surface to provide means for lateral electrical isolation;

a plurality of channel regions in said substrate, each placed away from and between said stripes in a self-aligned manner;

a plurality of substantially parallel source and drain regions in the surface of said substrate which are perfectly self-aligned on a first edge to said strips and on another edge to said channel regions;

a conductive gate layer, patterned as at least one set of a plurality of rows to form MIS gates oriented in a second direction, substantially orthogonal to said first direction, each one of said channel regions including at least one of said gates;

an insulation layer over said channel regions between said gate and said channel regions;

biasing circuitry for applying selected read biasing voltages to said MIS transistors; and sensing circuitry for sensing a current generated at said MIS transistors in accordance with the state of said addressable MIS transistors.

26. The device according to claim 25, wherein said addressable MIS transistors comprise SONOS tunneling metal insulator semiconductor field effect transistors.

27. The device according to claim 25, wherein said conductive gate layer comprise a metal silicide layer on top of a polysilicon material.

28. The device according to claim 25, wherein said substrate has a first conductivity type and said source and drain regions are semiconductor regions of a second conductivity type.

29. The device according to claim 25, wherein said substrate has a first conductivity type and said source and drain regions are semiconductor regions of a first conductivity type; and wherein said array of addressable MIS transistors further comprises a first well region of a second conductivity type formed in said substrate as to surround said array of addressable MIS transistors.

30. The device according to claim 25, wherein said substrate has a first conductivity type and said source and regions are semiconductor regions of a second conductivity type; and wherein said array of addressable MIS transistors further comprises a first well region of a first conductivity type formed in said substrate as to surround said array of addressable MIS transistors and wherein said device further comprises an additional second well region of the second conductivity type formed in said substrate as to surround at least said first well region.

31. The device according to claim 29, wherein means is provided to connect said substrate to said supply voltage and to connect said first well to a supply reference voltage, during a read operation.

32. The device according to claim 30, wherein means is provided to connect said substrate to said supply reference voltage and to connect said second well to said supply voltage and to additionally connect said first well to said supply reference voltage during a read operation.

33. The device according to claim 25, wherein said biasing circuitry for applying selected read biasing voltages provides means to:

pre-charge said drain regions to a first pre-charge value equal to the supply potential;

pre-charge said source regions to a second pre-charge value equal to a second voltage;

and selectively bias a pre-determined word line to a potential equal to said second voltage applied to said source regions so that current can flow between said source and drain of MIS transistors under favorable conditions.

* * * * *